United States Patent
Mohan et al.

(10) Patent No.: US 8,482,118 B2
(45) Date of Patent: Jul. 9, 2013

(54) INTEGRATED CIRCUIT MICRO-MODULE

(75) Inventors: Anuraag Mohan, Fremont, CA (US); Peter Smeys, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/467,259

(22) Filed: May 9, 2012

(65) Prior Publication Data

US 2012/0217625 A1 Aug. 30, 2012

Related U.S. Application Data

(60) Division of application No. 13/022,392, filed on Feb. 7, 2011, now Pat. No. 8,187,920, which is a continuation-in-part of application No. 12/643,924, filed on Dec. 21, 2009, now Pat. No. 7,902,661, which is a continuation-in-part of application No. 12/390,349, filed on Feb. 20, 2009, now Pat. No. 7,843,056.

(51) Int. Cl.
*H01L 23/04* (2006.01)
*H01L 23/12* (2006.01)
*H01L 23/053* (2006.01)
*H01L 23/34* (2006.01)

(52) U.S. Cl.
USPC ........... 257/698; 257/700; 257/713; 257/723; 257/724; 257/E21.499; 257/E21.575; 257/E21.506

(58) Field of Classification Search
USPC .......... 257/698, 700, 713, 723, 724, E21.499, 257/E21.575, E21.506
See application file for complete search history.

(56) References Cited

U.S. PATENT DOCUMENTS

| | | | |
|---|---|---|---|
| 7,589,392 B2 * | 9/2009 | Shastri et al. | 257/532 |
| 2007/0090533 A1 * | 4/2007 | Haga et al. | 257/777 |
| 2007/0181979 A1 * | 8/2007 | Beer et al. | 257/619 |
| 2009/0159875 A1 * | 6/2009 | Chabinyc et al. | 257/40 |

* cited by examiner

*Primary Examiner* — Mohsen Ahmadi
(74) *Attorney, Agent, or Firm* — Wade J. Brady, III; Frederick J. Telecky, Jr.

(57) ABSTRACT

One aspect of the present invention relates to an integrated circuit package that includes multiple layers of a planarizing, photo-imageable epoxy that are formed over a substrate. In some designs, the substrate is a silicon wafer. An integrated circuit is embedded in the epoxy. An antenna, which is electrically coupled to the active face of the integrated circuit through an interconnect layer, is formed over one of the epoxy layers. In various embodiments, at least some of the epoxy layers are positioned between the substrate and the antenna such that there is a distance of at least approximately 100 microns between the substrate and the antenna.

13 Claims, 20 Drawing Sheets

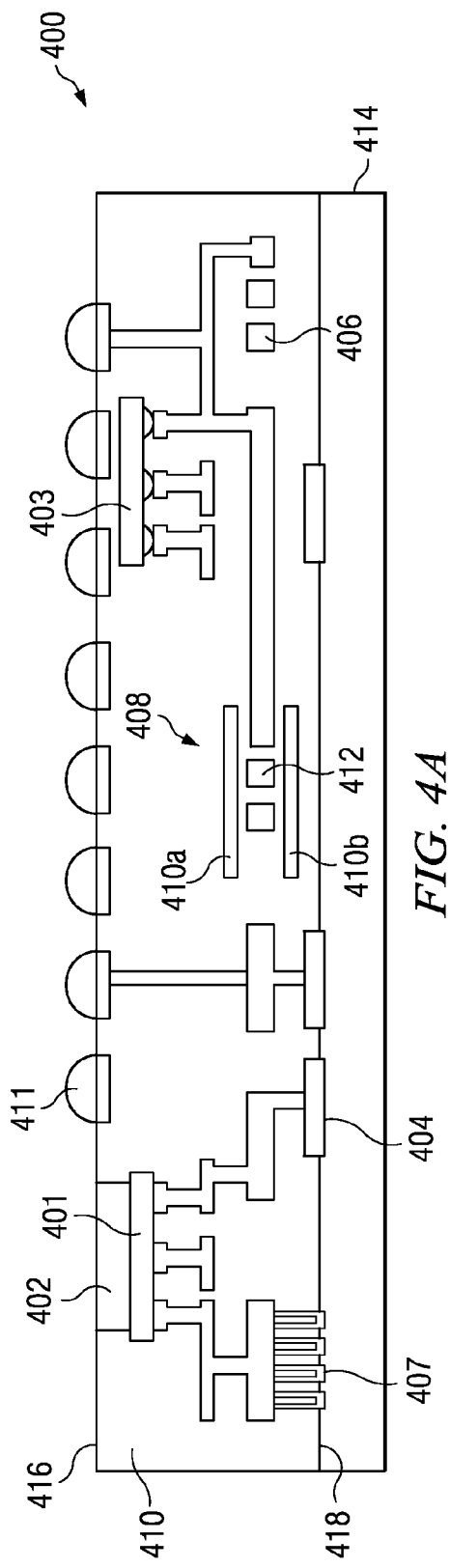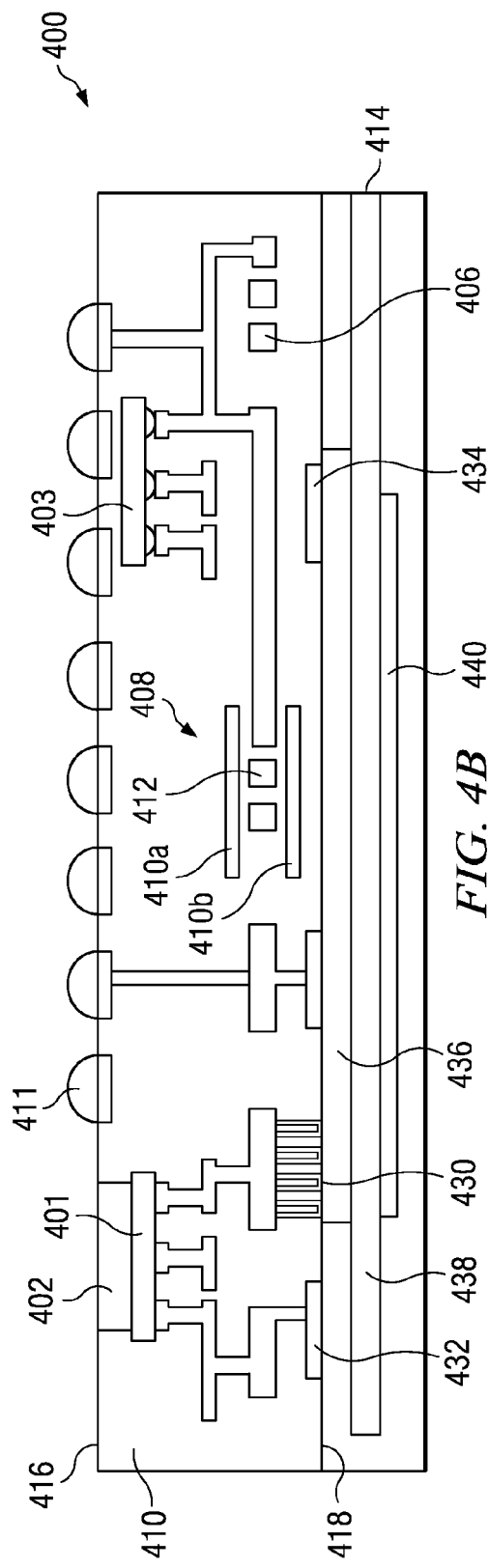

INTEGRATED CIRCUIT MICRO-MODULE

CROSS-REFERENCE TO RELATED APPLICATIONS

This application is a Division of U.S. patent application Ser. No. 13/022,392, entitled "Integrated Circuit Micro-Module," filed Feb. 7, 2011, which is a Continuation-in-Part of U.S. patent application Ser. No. 12/643,924 (now U.S. Pat. No. 7,902,661), entitled "Integrated Circuit Micro-Module," filed Dec. 21, 2009, which is a Continuation-in-Part of U.S. patent application Ser. No. 12/390,349 (now U.S. Pat. No. 7,843,056, entitled "Integrated Circuit Micro-Module," filed Feb. 20, 2009, all three of which are hereby incorporated by reference in their entirety for all purposes.

TECHNICAL FIELD

The present invention relates generally to the packaging of integrated circuits (ICs). More particularly, the present invention relates to integrated circuit micro-modules.

BACKGROUND OF THE INVENTION

Portable electronics, such as cell phones, tablet computers, laptops and personal data assistants (PDAs) are increasingly popular. Currently, many portable electronics contain one or more antennae for wireless communications. The antennae are used to transmit and/or receive electromagnetic signals. There are various ways to incorporate an antenna into a portable electronic device. By way of example, the antennae are often attached to an off-chip printed circuit board or integrated into the casing.

The radio systems within various portable electronic devices are becoming more sophisticated and are arranged to support an increasing number of data types and protocols (e.g., voice, data, Wi-Fi, GPS, Bluetooth etc.) At the same time, many of these devices are becoming smaller, lighter and more portable. As a result, a larger number of wireless components and antennae need to fit into a smaller space within the device. Although existing technologies work well for various applications, there are ongoing efforts to improve the performance and reduce the footprint of wireless components.

SUMMARY OF THE INVENTION

There is increasing demand for portable electronic devices that can communicate wirelessly via multiple protocols using multiple antennae. Off-chip, external antennae, however, generally take up substantial real estate within the device. A challenge for electronics manufacturers involves fitting a larger number of wireless components into a product without substantially increasing the product's size or weight.

To help reduce the footprint of the antennae, there are efforts to further miniaturize antennae for use in portable electronics. Some designs involve fabricating packages with integrated antennae at the wafer level. By way of example, a module may be formed from one or more layers of a semiconductor material, such as silicon. The module may be fabricated to include an antenna and an integrated circuit. An interconnect structure within the module electrically couples the antenna to the integrated circuit.

This approach, while effective for some applications, has various problems. Generally, the close proximity of a conductive material negatively affects the performance of the antenna. In an integrated circuit package, the distances between the silicon substrate and the antenna may be very small (e.g., 20 microns or less.) At that range, even a semiconductor like silicon is conductive enough to reduce the radiation efficiency of the antenna by 50% or more.

Various embodiments of the present invention address one or more of the above concerns. One aspect of the present invention relates to an integrated circuit package that includes multiple layers of a planarizing, photo-imageable epoxy that are formed over a substrate. In some embodiments, the epoxy is SU-8 and the substrate is a conventional silicon wafer handle. An integrated circuit is positioned in one of the epoxy layers. An antenna, which is electrically coupled to the active face of the integrated circuit through an interconnect layer, is also embedded within the epoxy. The antenna is arranged to wirelessly transmit signals from the integrated circuit by emitting electromagnetic radiation. Various implementations involve stacking at least some of the layers of epoxy between the antenna and the substrate such that the distance between the antenna and the substrate is at least 100 microns. In various preferred embodiments, the distance between the antenna and the substrate is at least 140 microns. This distance acts as a buffer between the antenna and the substrate and helps prevent radiation emissions from the antenna from inducing an electrical current in the substrate. Another aspect of the present invention relates to a method of making the above integrated circuit package.

The integrated circuit package can be made in a wide variety of ways, depending on the needs of a particular application. The integrated circuit package may include almost any number of epoxy layers, integrated circuits, antennae and interconnect layers. Various designs include additional structures that are embedded between adjacent epoxy layers, including passive devices (e.g., resisters, capacitors, inductors, etc.), ground planes, sensors, heat sinks and thermal pipes.

BRIEF DESCRIPTION OF THE DRAWINGS

The invention and the advantages thereof may best be understood by reference to the following description taken in conjunction with the accompanying drawings in which:

FIGS. 4A-4E illustrate diagrammatic cross-sectional views of packages in accordance with various alternative embodiments of the present invention.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

In one aspect, the present invention relates generally to integrated circuit (IC) packages and more specifically to IC micro-module technology. This aspect involves a micro-module made of multiple layers of a dielectric that is preferably photo-imageable and readily planarized. The micro-module may contain a variety of components including one or more integrated circuits, interconnect layers, heat sinks, conductive vias, passive devices, MEMS devices, sensors, thermal pipes etc. The various components can be arranged and stacked within the micro-module in a wide variety of different ways. The layers and components of the micro-module can be deposited and processed using various conventional wafer level processing techniques, such as spin coating, spray coating, lithography and/or electroplating. Another aspect of the present invention relates to wafer level manufacturing techniques and structures that integrate multiple active and/or passive components into a single, cost-effective, high-performance package.

Figure 1:
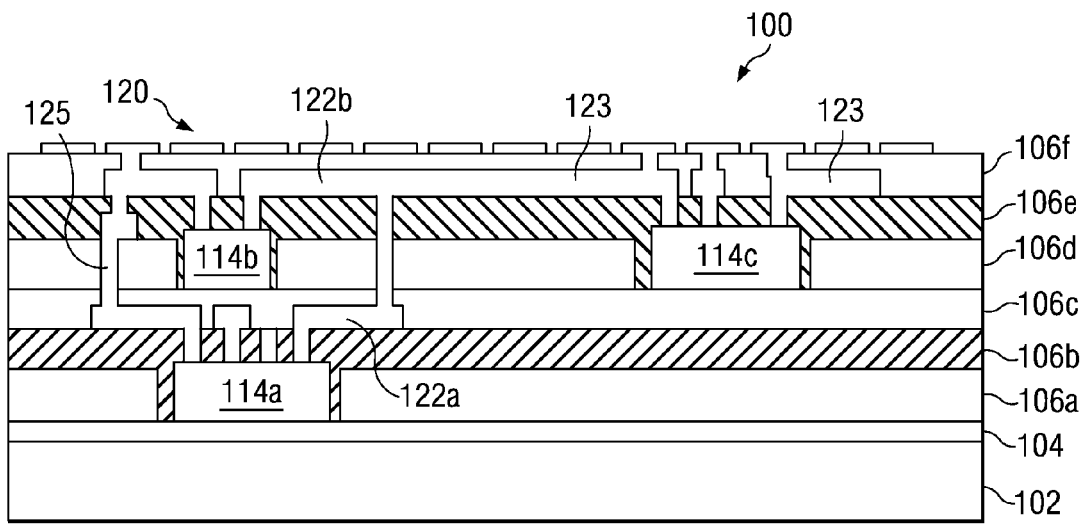
FIG. 1 illustrates a diagrammatic cross-sectional view of a package containing multiple integrated circuits and interconnect layers in accordance with an embodiment of the present invention

FIG. 1 illustrates a package according to one embodiment of the present invention. In the illustrated embodiment, a multi-tiered package 100 includes a substrate 102, a heat sink 104, a plurality of stacked dielectric layers 106, integrated circuits 114, passive components (not shown), interconnect layers 122, vias 125 and external contact pads 120. The heat sink 104 is formed over the substrate 102 and the dielectric layers 106 are stacked on top of the heat sink. Interconnect layers are interspersed as needed between adjacent dielectric layers 106. The integrated circuits are embedded within stacked layers of a dielectric 106, and may be electrically connected to other components (e.g., other ICs, passive components, external contact pads 120, etc. by appropriate traces in the interconnect layers 122 and vias 125. In the illustrated embodiment, one of the integrated circuits (114a) is effectively mounted on the heat sink 104 to provide good heat dissipation.

The dielectric layers 106 may be made from any suitable dielectric material. In various preferred embodiments, the dielectric layers 106 are made from a material that is readily planarized and/or photo-imageable. In a particular preferred embodiment, the layers are pmade from photo-imageable, planarizing SU-8, although other suitable materials may be used as well. In some designs the dielectric used for layers 106 is highly viscous when initially applied, and is subsequently partially or fully cured during a photolithographic process. The layers 106 may be applied using a variety of suitable techniques, including spin coating and spray coating. The thickness of the various dielectric layers can vary widely in accordance with the needs of a particular application and the different layers do not need to have the same thickness (although they may have the same thickness).

The integrated circuits 114 within package 100 can be arranged in a wide variety of ways and may be placed at almost any location within the package. By way of example, different integrated circuits 114 may be positioned in the substrate 102, different photo-imageable layers and/or within the same layer. In various embodiments, the integrated circuits 114 can be stacked, positioned side-by-side, placed in close proximity to one another and/or be separated by a substantial distance relative to the overall size of package 100. Integrated circuits positioned in different layers may be positioned directly or partially over one another or they may be separated such that they do not overlie one another. Integrated circuits 114 can also have a variety of different form factors, architectures and configurations. For example, they may take the form of relatively bare dice (e.g., unpackaged dice, flip chips etc.), partially and/or fully packaged dice (e.g., BGAs, LGAs, QFNs, etc.)

The electrical interconnects within the package 100 may be arranged in a wide variety of different ways as well. The embodiment illustrated in FIG. 1 includes two interconnect (trace) layers 122a and 122b. More or fewer interconnect layers are possible in different implementations. Each interconnect layer typically has at least one (but typically many) traces 123 that are used to help route electrical signals between different components of the package. The interconnect layers 122 are generally formed on top of an associated one of the planarized dielectric layers 106. The trace layer is then buried or covered by the next dielectric layer. Thus, the interconnect layers generally extend in planes that are parallel with and embedded within the dielectric layers.

Since the interconnect layers (and potentially other components of the package) are formed on top of a dielectric layer, it is desirable for the dielectric layers 106 to have a very flat and hard surface upon which other components (e.g. traces, passive components, etc.) may be formed or discrete components (e.g. ICs) may be mounted. SU-8 is particularly well suited for this application because it readily self-planarizes when applied using conventional spin-on and spray coating techniques and it is very hard when cured. Indeed, spun on SU-8 can be used to form a hard flat surface that does not require any additional planarizing (e.g., chemical mechanical polishing) before a high quality interconnect layer is formed thereon using conventional sputtering/electroplating techniques. Dielectric materials that can be applied in this manner to form a very flat surface are referred to herein as planarizing dielectrics.

Electrically conductive vias 125 are provided to electrically connect components (e.g., ICs/traces/contacts/passive components, etc.) that reside at different layers of the package. The vias 125 are arranged to extend through an associated dielectric layer 106. By way of example, the vias 125 may be used to couple traces from two different interconnect layers together; a die or another component to an interconnect layer; a contact to a trace, die or other component, etc. As will be described in more detail below, metalized vias may be formed at the same time that an associated interconnect layer 122 is deposited by filling via openings that were earlier formed in an associated dielectric layer 106.

Package 100 can include many other types of devices than the ones illustrated in FIG. 1. In the illustrated embodiment, only several integrated circuits and interconnect layers are shown. Package 100, however, can also contain almost any number of active and/or passive devices. Examples of such active and/or passive devices includes resistors, capacitors, magnetic cores, MEMS devices, sensors, cells (e.g., encapsulated lithium or others), integrated thin film battery structures, inductors, etc. These devices can be positioned and/or stacked in various locations within package 100. The components may take the form of prefabricated discrete components or may be formed in-situ. One advantage of the lithography-based process used to create package 100 is that these and other components can be formed in-situ during the layered formation of the package. That is, while prefabricated, discrete components can be placed in almost any position within package 100, components can also be fabricated directly onto any photo-imageable layer 106 using any suitable technique, such as conventional sputtering and/or electroplating. Due to the nature of this fabrication process, superior matching, precision and control can be achieved and low stress packaging is possible over various die and/or substrate sizes, including medium and large ones.

The substrate 102 may be made of any suitable material, including silicon, glass, steel, quartz, G10-FR4, any other FR4 family epoxy, etc. Depending on the needs of a particular application, the substrate can be electrically conductive, electrically insulating and/or optically transparent. In some embodiments, the substrate is used only as a carrier during fabrication and is accordingly removed before the package is completed. In other embodiments, the substrate remains an integral part of the package. If desired, the substrate 102 may be thinned after assembly by backgrinding or other suitable techniques. In still other embodiments, the substrate may be omitted entirely.

In some embodiments, the substrate 102 can integrate one or more sensors (not shown.) This approach enables the integration of sensor components without the packaging and reliability concerns often associated with the sensor's requirements to be exposed to the environment. Sensors can be mounted on either side of the substrate 102 and can be embedded or exposed to the environment through etched windows or micro-channels. Examples of suitable sensors include but are not limited to biosensors, sensors for gas, chemical, electromagnetic, acceleration, vibration, temperature, humidity etc.

One approach is to integrate a sensing element into the backside of the substrate 102. The sensing element can be built inside a deep cavity in the substrate 102 that has been etched from the backside of the substrate 102. For example the sensing element may be a capacitor made from electroplated Cu fingers. The capacitor can be connected with contact pads on the frontside of the substrate 102 through microvias. Package 100 can be formed over these contact pads such that the capacitor is electrically coupled with at least some of the electrical devices and interconnect layers within package 100. The sensing element inside the cavity that is created on the backside of the wafer can be filled with the gas sensitive material and can be automatically exposed to the environment, while the active circuitry on the frontside of substrate 102 can be protected by conventional encapsulation techniques, such as those discussed below in connection with FIG. 5E.

Package 100 also includes a system for dissipating internally generated heat, which can include thermal pipes and heat sinks, such as heat sink 104. Such a system can play an important role in the performance of the package 100, because packages with high power densities and multiple embedded devices may need to have good heat dissipation to function properly. The thermal pipes and heat sinks are generally formed at substantially the same time and using the same techniques as the interconnect layers 122. Such thermal pipes can penetrate and/or wind through one or more interconnect layers and/or photo-imageable layers. Any single, continuous thermal pipe, trace and/or via can branch off into multiple other traces and/or vias at almost any point and can extend in more than one direction, such as laterally and/or vertically within the package. The thermal pipes can thermally couple virtually any device within the package 100 with one or more heat dissipation pads and/or heat sinks located on the exterior of the package 100.

The heat sink 104 can have a variety of different architectures. In the illustrated embodiment heat sink 104 forms a layer having a footprint that substantially matches the footprint of the photo-imageable layers of package 100. Alternatively, the package 100 could include one or more heat sinks whose dimensions at least partly match those of an overlying or underlying active device, such as an integrated circuit. In the illustrated embodiment, the heat sink takes the form of a layer or sheet 104 formed over the substrate and forms a base for the dielectric layers 106. If desired, integrated circuits 104 can be mounted directly on the heat sink layer as illustrated by integrated circuit 114(a). Alternatively, thermally conductive vias (not shown) may be used to improve the thermal path between a buried integrated circuit and the heat sink as illustrated by integrated circuit 114(b). In some embodiments, the heat sink(s) or heat sink layer(s) are exposed on a top or bottom surface of the package. In others, a substrate or other layer may cover the heat sink(s) or heat sink layers such that the heat sinks function as heat spreaders. The heat sink(s) 104 may be made of a variety of suitable conductive materials, such as copper and may be formed in the same manner as the interconnect layers.

Various embodiments of the package 100 can incorporate a variety of other features as well. For example, package 100 can incorporate high voltage (HV) isolation and an embedded inductive galvanic capability. It can feature wireless interfaces e.g., RF antennas for wireless system IO, EM power scavenging, RF shielding for EMI sensitive application, etc. In various embodiments, package 100 can include power management subsystems e.g., superchargers, integrated photovoltaic switches etc. The package 100 could be formed on a wafer and encapsulated e.g., as shown in FIG. 5E. Sensing surfaces and materials can be integrated into other processing steps for the package 100 and the wafer e.g., as discussed above and in connection with FIGS. 5A-5H, 6A-6C and 7A-7C.

Figure 2:
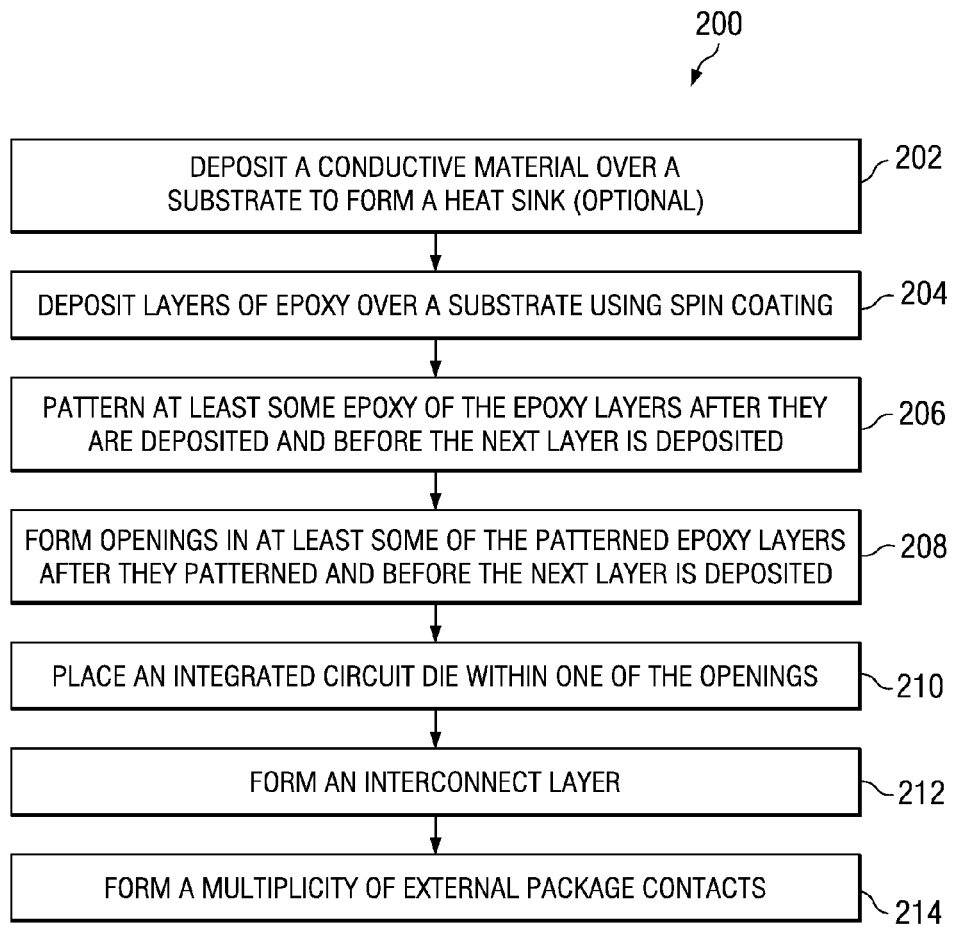
FIG. 2 is a process flow diagram illustrating a wafer level process for packaging integrated circuits in accordance with an embodiment of the present invention.

Referring next to FIG. 2, a wafer level method 200 for forming integrated circuit package 100 according to an embodiment of the present invention will be described. The steps of method 200 are illustrated in FIGS. 3A-3L. The steps of method 200 may be repeated and/or performed out of the illustrated order. It should be noted that the process depicted in method 200 may be used to concurrently form many structures other than those shown in FIGS. 3A-3L.

Figure 3A:
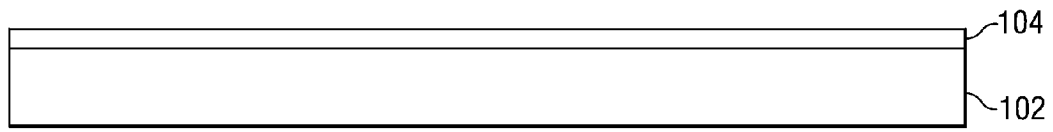
FIGS. 3A-3L illustrate diagrammatic cross-sectional views of selected steps in the process of FIG. 2.

Initially, in step 202 of FIG. 2, an optional conductive layer 104 of FIG. 3A is formed over a substrate 102 using any of a variety of suitable techniques. By way of example, sputtering of a seed layer followed by conventional electroplating works well. Of course other suitable conductive layer formation techniques may be used as well. The conductive layer 104 functions as a heat sink and may be made of various materials, such as copper or other appropriate metals or metal layer stacks. The substrate 102 may be a wafer and can be made of a variety of suitable materials, such as silicon, G10-FR4, steel, glass, plastic, etc.

Figure 3B:
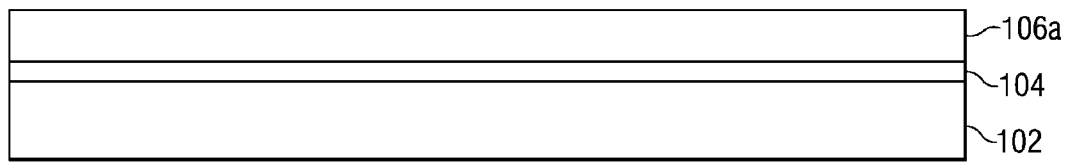

In FIG. 3B, a layer of planarizing, photo-imageable epoxy 106a is deposited over the heat sink 104 (step 204 of FIG. 2). This can be done using a variety of techniques, such as spin coating, spray coating or sheet lamination. In the illustrated embodiment, the epoxy layer 106a is SU-8, although other appropriate dielectric materials may be used. SU-8 is well suited for applications using conventional spin-on coating techniques.

SU-8 has various advantageous properties. It is a highly viscous, photo-imageable, chemically inert polymer that can solidify when exposed to UV radiation, for example, during a photolithographic process. SU-8 provides greater mechanical strength relative to some other known photoresists, is resistant to overpolishing and is mechanically and thermally stable at temperatures up to at least 300° C. It planarizes easily and evenly using spin coating relative to certain other photo-imageable materials such as BCB, which allows it to be readily used as a base upon which interconnects or passive components may be fabricated, and upon which integrated circuits or other passive components may be mounted. It can readily be used to create dielectric layers with thicknesses in the range of 1 um to 250 um and both thinner and thicker layers are possible. In particular embodiments, openings can be formed in SU-8 having high aspect ratios (e.g. approximately 5:1 or greater) which facilitates the formation of components such as conductive vias or other structures with high aspect ratios. By way of example, aspect ratios of 7:1 are readily obtainable. Relative to many other materials, superior control, precision and matching can be achieved with SU-8 layers, which can result in higher densities and improved performance. Other suitable dielectric materials with one or more of the above characteristics may also be used in place of SU-8.

In step 206 of FIG. 2, epoxy layer 106a is patterned using conventional photolithographic techniques. In one embodiment, a mask is used to selectively expose portions of the epoxy layer 106a. The exposure can be followed by a baking operation. These operations can cause the exposed portions of the epoxy layer 106a to crosslink. During the photolithographic process, exposed portions of epoxy layer 106a may be cured, partially cured (e.g., B-staged) or otherwise altered or hardened relative to the unexposed portions to facilitate later removal of unexposed portions of the epoxy.

Figure 3C:
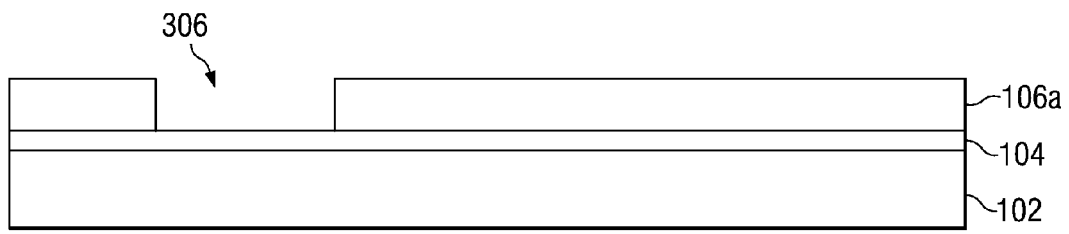

In step 208 of FIG. 2 and FIG. 3C, unexposed portions of the epoxy layer 106a are removed to form one or more openings 306 in the epoxy layer 106a. This removal process can be performed in a variety of ways. For example, the epoxy layer 106a can be developed in a developer solution, resulting in the dissolution of the unexposed portions of the layer 106a. A hard bake can be performed after the developing operation.

Figure 3D:
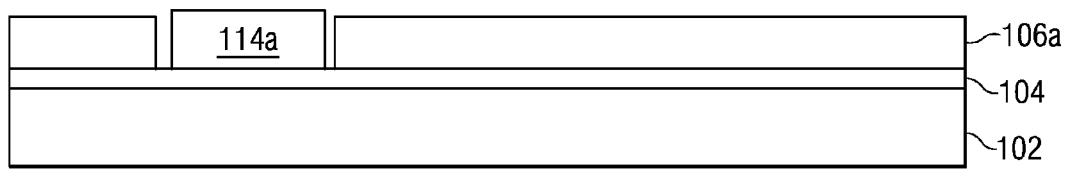

In step 210 of FIG. 2 and FIG. 3D, an integrated circuit 114a is placed in opening 306 and mounted on the heat sink 104. The integrated circuit 114a may be configured in a variety of ways. For example, the integrated circuit 114a may be a bare or flip chip die, or it could have a BGA, LGA and/or other suitable pinout configuration. In the illustrated embodiment, the thickness of the integrated circuit 114a is greater than the thickness of the epoxy layer 106a in which it is initially embedded, although in other embodiments, the die may be substantially the same thickness, or thinner than the epoxy layer in which it is initially embedded. The active face of the integrated circuit 114a may face up or down. In particular embodiments, the integrated circuit 114a may be attached and thermally coupled to heat sink 104 using an adhesive.

Figure 3E:
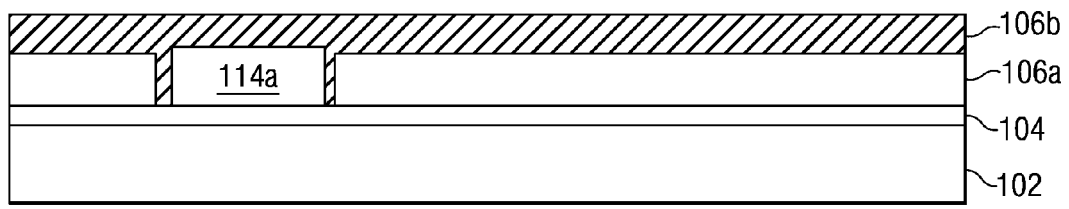

After the integrated circuit 114a has been positioned in opening 306 and attached to the heat sink, a second layer of epoxy 106b is applied over the integrated circuit 114a and the epoxy layer 106a (step 204 of FIG. 2) as illustrated in FIG. 3E. Like the first epoxy layer 106a, the second epoxy layer 106b may be deposited using any suitable method, such as spin coating. In the illustrated embodiment, epoxy layer 106b is directly over, immediately adjacent to and/or in direct contact with integrated circuit 114a and epoxy layer 106a, although other arrangements are possible. The epoxy layer 106b may completely or partially cover the active surface of integrated circuit 114a.

Figure 3F:
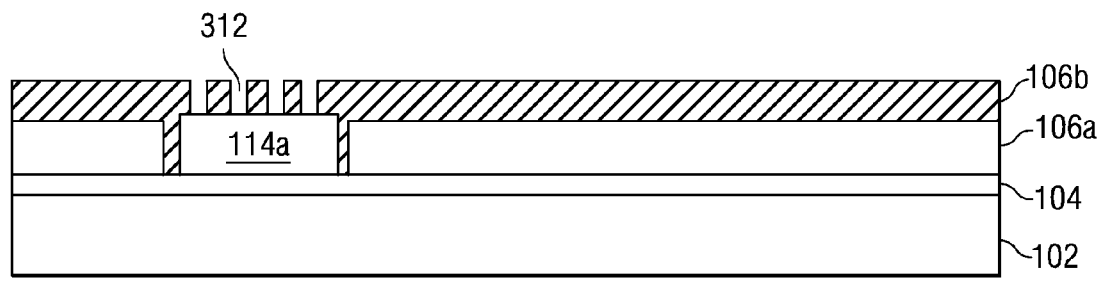

After epoxy layer 106b has been applied, it is patterned and developed using any suitable techniques (steps 206 and 208), which would typically be the same techniques used to pattern the first epoxy layer 106a. In the illustrated embodiment, via openings 312 are formed over integrated circuit 114a to expose I/O bond pads (not shown) on the active surface of integrated circuit 114a. The resulting structure is illustrated in FIG. 3F.

Figure 3G:
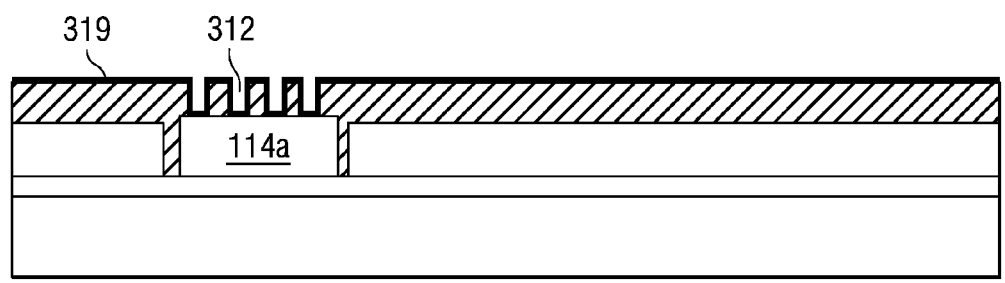

After any appropriate via openings 312 have been formed, a seed layer 319 is deposited over openings 312 and epoxy layer 106b, as shown in FIG. 3G. The seed layer 319 can be made of various suitable materials, including a stack of sequentially applied sublayers (e.g., Ti, Cu and Ti) and can be be deposited using a variety of processes (e.g., by sputtering a thin metal layer on the exposed surfaces.) A feature of the described approach is that the sputtered seed layer tends to coat all exposed surfaces including the sidewalls and bottoms of via openings 312. The deposition of seed layer 319 can also be limited to just a portion of the exposed surfaces.

Figure 3H:
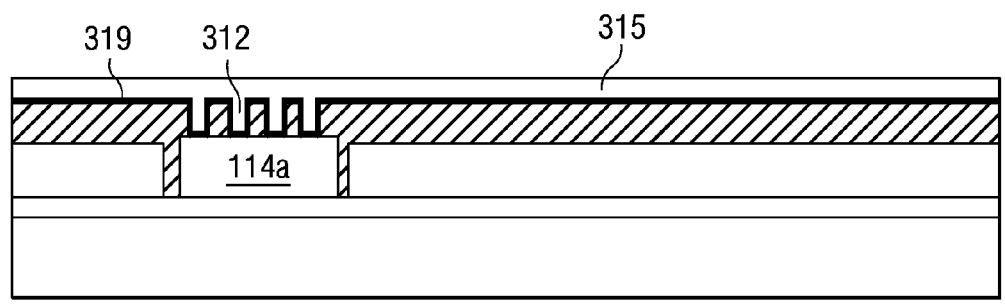
Figure 3I:
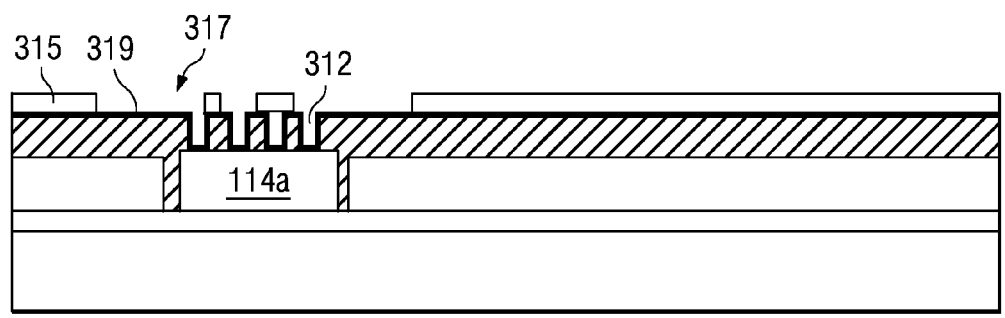

In FIG. 3H, a photoresist 315 is applied over the seed layer 319. The photoresist 315, which can be positive or negative, covers seed layer 319 and fills openings 312. In FIG. 3I, the photoresist is patterned and developed to form open regions 317 that expose the seed layer 319. The open areas are patterned to reflect the desired layout of the interconnect layer, including any desired conductive traces and heat pipes, and any vias desired in the underlying epoxy layer 106(b). After the desired open areas have been formed, the exposed portions of the seed layer are then electroplated to form the desired interconnect layer structures. In some embodiments, a portion of the seed layer (e.g., Ti) is etched prior to electroplating. During electroplating, a voltage is applied to seed layer 319 to facilitate the electroplating of a conductive material, such as copper, into the open regions 317. After the interconnect layer has been formed, the photoresist 315 and the seed layer 319 in the field is then stripped.

Figure 3J:
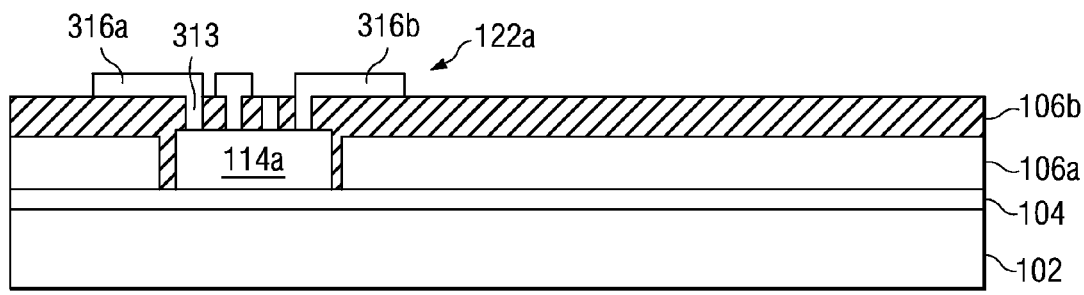

As a result, interconnect layer 122a is formed over the epoxy layer 106b, as illustrated in FIG. 3J (step 212). The aforementioned electroplating served to fill the via opening with metal thereby forming metal vias 313 in the spaces formerly defined by the via openings. The metal vias 313 may be arranged to electrically couple the I/O pads of the integrated circuit 114a with corresponding traces 316 of interconnect layer 122a. Because seed layer 319 has been deposited on both the sidewalls and bottoms of openings 312, the conductive material accumulates substantially concurrently on the sidewalls and the bottoms, resulting in the faster filling of openings 312 than if the seed layer were coated only on the bottom of openings 312.

Although not shown in epoxy layers 106a and 106b, other vias can also be formed all the way through one or more epoxy layers to couple components (e.g. traces, passive devices, external contact pads, ICs, etc. together). In still other arrangements conductive vias may be formed between a surface of a bottom (or other) surface of an integrated circuit and the heat sink layer 104 to provide a good thermal conduction path to the heat sink even when the metallization is not used for its current carrying capabilities. In general, interconnect layer 122a can have any number of associated traces and metal vias and these conductors can be routed in any manner appropriate for electrically coupling their associated package components.

It is noted that a particular sputtering/electro-deposition process has been described that is well suited for forming traces over and vias within an associated epoxy layer 106 at substantially the same time. However, it should be appreciated that a variety of other conventional or newly developed processes may be used to form the vias and traces either separately or together.

Figure 3K:
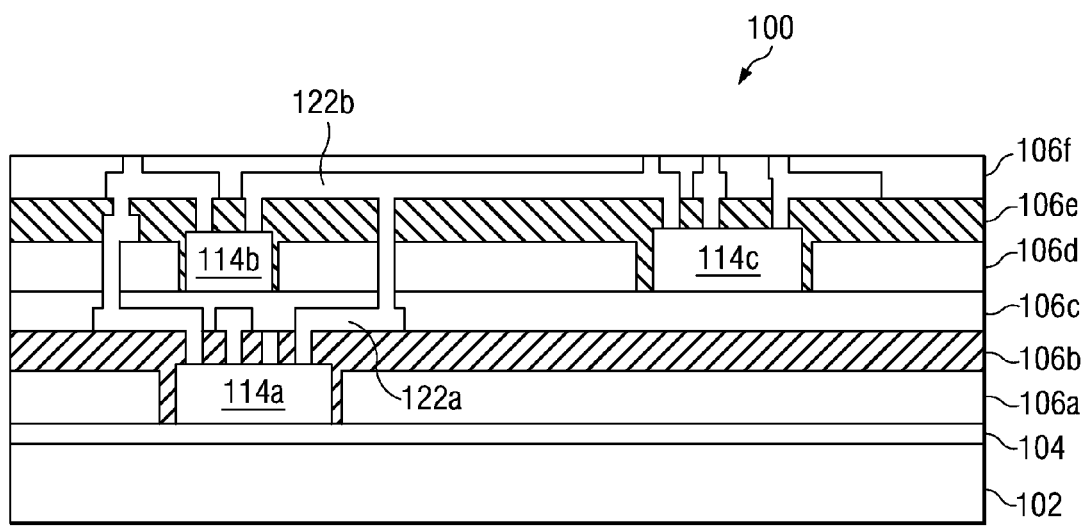

After the interconnect layer 122a has been formed, steps 204, 206, 208, 210 and/or 212 can generally be repeated in any order that is appropriate to form additional epoxy layers, interconnect layers, and to place or form appropriate components therein or thereon to form a particular package 100 such as the package illustrated in FIG. 3K. By way of example, in the illustrated embodiment additional epoxy layers 106c-106f are applied over layer 106b (effectively by repeating step 204 as appropriate). Integrated circuits 114b and 114c are embedded within epoxy layers 106d and 106e (steps 206, 208 and 210). Another interconnect layer 122b is formed within top epoxy layer 106f (steps 206, 208 and 212) and so on.

It should be appreciated that integrated circuits and interconnect layers in package 100 may be arranged in a variety of ways, depending on the needs of a particular application. For example, in the illustrated embodiment, the active faces of some integrated circuits are stacked directly over one another (e.g., integrated circuits 114a and 114b). Some integrated circuits are embedded within the same epoxy layer or layers (e.g., integrated circuits 114b and 114c.) Integrated circuits may be embedded in epoxy layers that are distinct from epoxy layers in which interconnect layers are embedded (e.g., interconnect layer 318a and electrical circuits 114a and 114b). ("Distinct" epoxy layers means layers where each layer is deposited in a single, cohesive coat in a sequence with the other layers, as is the case with epoxy layers 106a-106e.) Integrated circuits may be stacked over and/or situated in close proximity to one another. Integrated circuits may also be electrically coupled via electrical interconnect layers, vias and/or traces that extend substantially beyond the immediate vicinity or profile of any single integrated circuit (e.g., integrated circuits 114b and 114c).

Figure 3L:
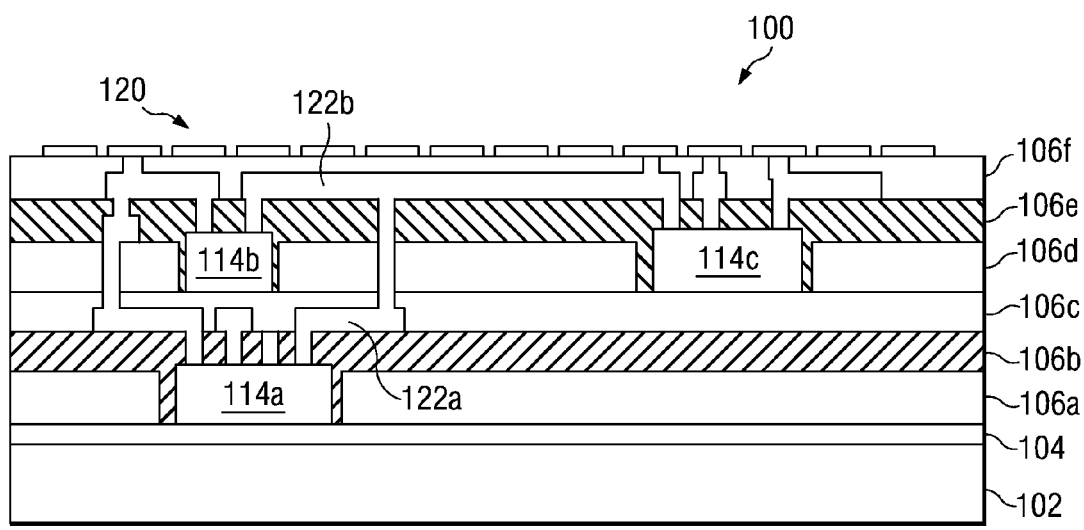

In step 214 of FIG. 2 and FIG. 3L, optional external contact pads 120 can be added to a top surface of package 100. The external contact pads 120 may be placed on other surfaces and formed in a variety of ways. For example, top epoxy layer 106f may be patterned and developed using the techniques described above to expose portions of electrical interconnect layer 122b. Any suitable metal, such as copper, may be electroplated into the holes on epoxy layer 106f to form conductive vias and external contact pads 120. As a result, at least some of the external contact pads 120 can be electrically coupled with electrical interconnect layers 122a-122b and/or integrated circuits 114a-114c.

The features of package 100 may be modified in a variety of ways. For example, it could contain more or fewer integrated circuits and/or interconnect layers. It could also contain multiple additional components, such as sensors, MEMS devices, resistors, capacitors, thin film battery structures, photovoltaic cells, RF wireless antennas and/or inductors. In some embodiments, substrate 102 is background away or otherwise discarded. Substrate 102 may have any suitable thickness. By way of example, thicknesses in the range of approximately 100 to 250 um work well for many applications. The thickness of the package 100 may vary widely. By way of example, thicknesses in the range of 0.5 to 1 mm work well in many applications. The thickness of electrical interconnect layers 122a and 122b may also widely vary with the needs of a particular application. By way of example, thicknesses of approximately 50 microns are believed to work well in many applications.

FIG. 4A is a cross-sectional view of another embodiment of the present invention. Similar to package 100 of FIG. 1, package 400 of FIG. 4A includes integrated circuits 401 and 403, epoxy layers 410 and multiple interconnect layers. Package 400 also includes some additional optional features that are not shown in package 100.

For example, package 400 features an integrated circuit 401 that is thermally coupled with a heat sink 402. In the illustrated embodiment, some of the dimensions of heat sink 402 are substantially similar to those of the thermally coupled device. In particular embodiments, heat sink 402 may be larger or smaller than its underlying device. Heat sink 402 may be positioned on and/or be in direct contact with a top or bottom surface of the integrated circuit 401. It may have direct access to an external surface of package 400 (as is the case in the illustrated embodiment), or be connected to the external surface via one or more thermal vias. Heat sink 402 can be thermally coupled with a conductive layer, such as layer 104 of FIG. 1. In a preferred embodiment in which the epoxy layers 410 are made of SU-8, having a heat sink 402 directly below integrated circuit 401 can be particularly helpful, since heat does not conduct well through SU-8.

Package 400 also features various passive components, such as inductors 406 and 408, resistor 404 and capacitor 407. These passive components may be situated in any epoxy layer or location within package 400. They may be formed using a variety of suitable techniques, depending on the needs of a particular application. For example, inductor windings 412 and inductor cores 410a and 410b can be formed by depositing conductive material and ferromagnetic material, respectively, over at least one of the epoxy layers 410. Thin-film resistors may be formed by sputtering or applying any suitable resistive material, such as silicon chromium, nickel chromium and/or silicon carbide chrome, over one of the epoxy layers 410. Capacitors can be formed by sandwiching a thin dielectric layer between metal plates deposited over one or more epoxy layers. Prefabricated resistors, inductors and capacitors may be placed on one or more epoxy layers 410 as well. Conductive, ferromagnetic and other materials can be deposited using any suitable method known in the art, such as electroplating or sputtering.

Package 400 also includes optional BGA-type contact pads 411 on frontside surface 416. Because of the location of the contact pads 410, substrate 414 can be made of various materials, such as G10-FR4, steel or glass. In particular embodiments where the contact pads are on the backside surface 418, the substrate 414 can be made of silicon and feature through vias that enable electrical connections with the contact pads.

In another embodiment, the substrate is primarily used as a building platform to form the package 400 and is ultimately ground off.

FIG. 4B illustrates another embodiment of the present invention, which has many of the features illustrated in FIG. 4A. This embodiment includes additional components, including precision trim-able capacitor 430 and resistor 432, micro-relay 434, low cost configurable, precision passive feedback network 436, FR-4 mount 438, and photovoltaic cell 440. Cell 440 could be covered with a layer of transparent material, such as transparent SU-8. In other embodiments, photovoltaic cell 440 could be replaced by a windowed gas sensor, a wireless phased antenna array, a heat sink or another suitable component. Package 400 can include many additional structures, including a power inductor array, a RF capable antenna, thermal pipes and external pads for dissipating heat from the interior of the package 100.

Figure 4C:
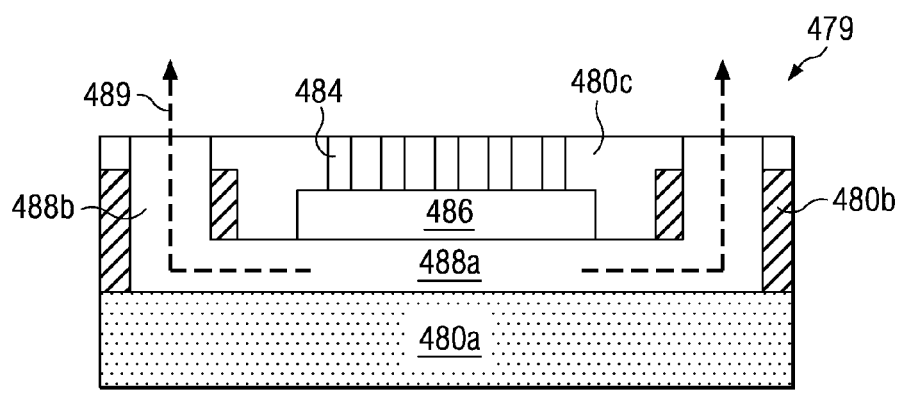
Figure 4D:
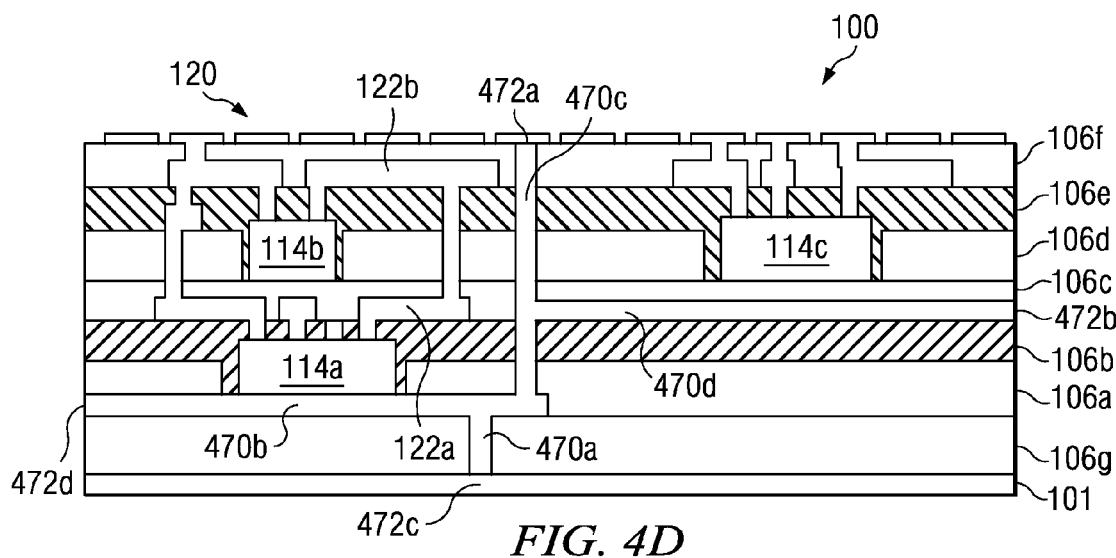

FIGS. 4C and 4D illustrate two other embodiments having thermal pipes. FIG. 4B illustrates a package 479 that includes an integrated circuit 486 embedded in multiple layers of planarizing, photo-imageable epoxy 480. Metal interconnects 484 are coupled with bond pads (not shown) on the active surface of the integrated circuit 486. The backside of the integrated circuit 486 is mounted onto a thermal pipe 488, which includes thermal trace 488a and thermal vias 488b. Thermal pipe 488 is made of any suitable material that conducts heat well, such as copper. As indicated by the dotted line 489, heat from the integrated circuit 486 is routed through the backside of the integrated circuit 486, around thermal trace 488a and up through thermal vias 488b, so that the heat is ventilated through the external top surface of the package 479. The embodiment illustrated in FIG. 4B can be fabricated using various techniques, such as the ones discussed in connection with FIGS. 3A-3K.

FIG. 4D illustrates another embodiment of the present invention. The embodiment includes an integrated circuit 114a whose bottom surface is thermally coupled with thermal pipes 470. Thermal pipes 470 are made from a thermally conductive material, such as copper, and transmit heat from the integrated circuit 114a to external heat ventilation sites 472 of package 100. Heat dissipation can pose a problem for packages with multiple integrated devices and high power densities. Thermal pipes 470, which can be coupled with one or more devices within package 100, allow internally generated heat to be transported to one or more external surfaces of package 100. In FIG. 4C, for example, heat is conducted away from the integrated circuit 114a to heat ventilation sites 472 on the top, bottom and multiple side surfaces of package 100, although heat ventilation sites can be located on almost any location on the exterior of the package 100.

Heat sinks can also be mounted on the top, bottom, side and/or almost any external surface of the package 100. In the illustrated embodiment, for example, heat spreader 101, which is on the bottom surface of package 100, is thermally coupled with thermal pipes 470 and dissipates heat over the entire bottom surface area of package 100. In one embodiment, all of the thermal pipes in the package 100, which are thermally coupled with multiple embedded integrated circuits, are also coupled with heat spreader 101. In a variation on this embodiment, some of the thermal pipes are also coupled with a heat sink located on the top surface of the package 100. Thermal pipes 470 can be formed using processes similar to those used to fabricate interconnect layers 122. They can be coupled with multiple passive and/or active devices within package 100 and can extend in almost any direction within package 100. In the illustrated embodiment, for example, thermal pipes 470 extend both parallel and perpendicular to some of the planes formed by the photo-imageable layers 106. As shown in FIG. 4C, thermal pipes 470 can include thermal traces 470b and 470d and/or vias 470a and 470c that penetrate one or more interconnect layers 122 and/or photo-imageable layers 106. The thermal pipes 470 can be configured to dissipate heat, conduct electrical signals, or both. In one embodiment, an interconnect layer for transmitting electrical signals and a thermal pipe that is not suitable for transmitting electrical signals are embedded within the same epoxy layer.

Figure 4E:
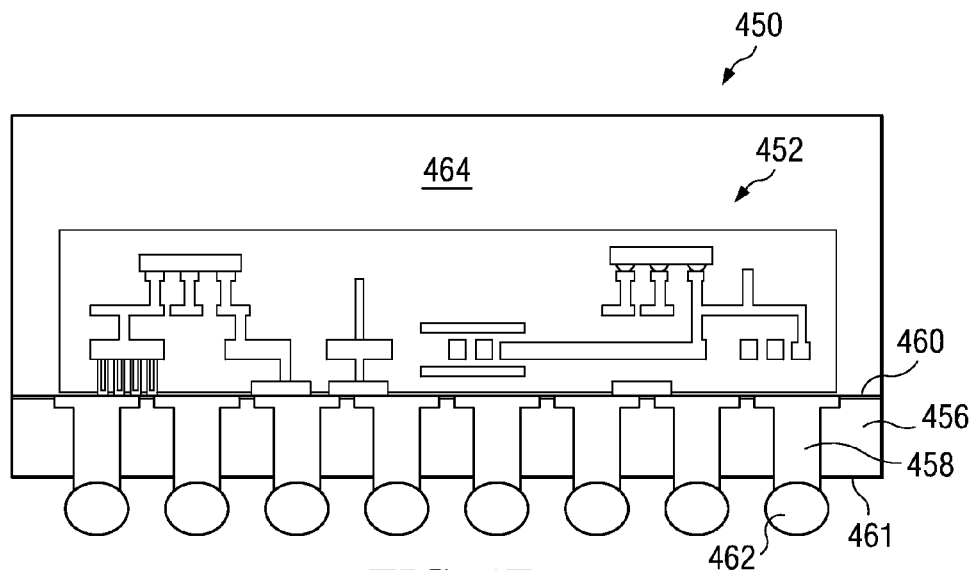

Another embodiment of the present invention is illustrated in FIG. 4E. Package arrangement 450 includes a microsystem 452 formed on the top surface 460 of substrate 456. Microsystem 452 may include multiple dielectric layers, interconnect layers, active and/or passive components and can have any of the features described in connection with package 100 of FIG. 1 and/or package 400 of FIG. 4A. Microsystem 452 and top surface 460 of substrate 465 are encapsulated in molding material 464, which may be made of any suitable material, such as a thermosetting plastic. Multiple metallic vias 458 electrically couple external pads (not shown) on the bottom of microsystem 452 with the bottom surface 461 of substrate 456. The vias 458 terminate at optional solder balls 462, which can be made from various conductive materials. Solder balls 462 may be mounted on, for example, a printed circuit board to enable electrical connections between microsystem 452 and various external components.

Figure 5A:
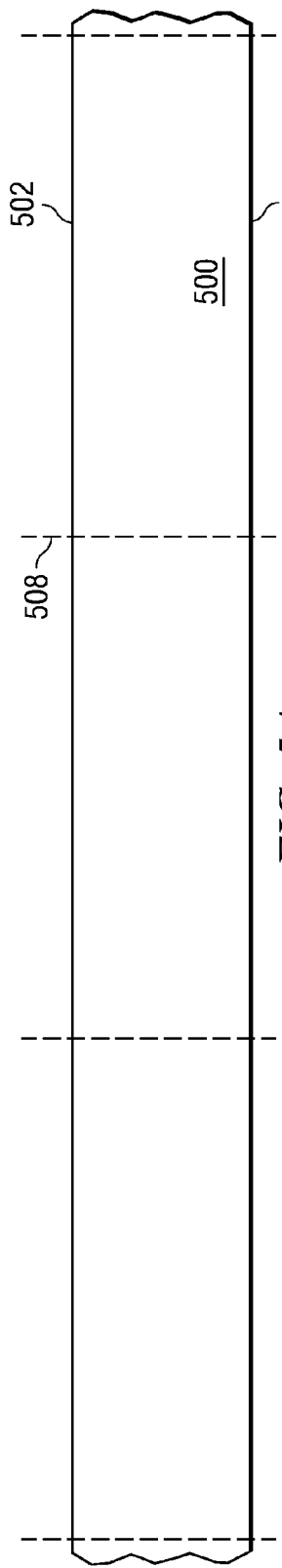
FIGS. 5A-5H illustrate selected steps in a wafer level process for packaging integrated circuits in accordance with another embodiment of the present invention.
Figure 5B:
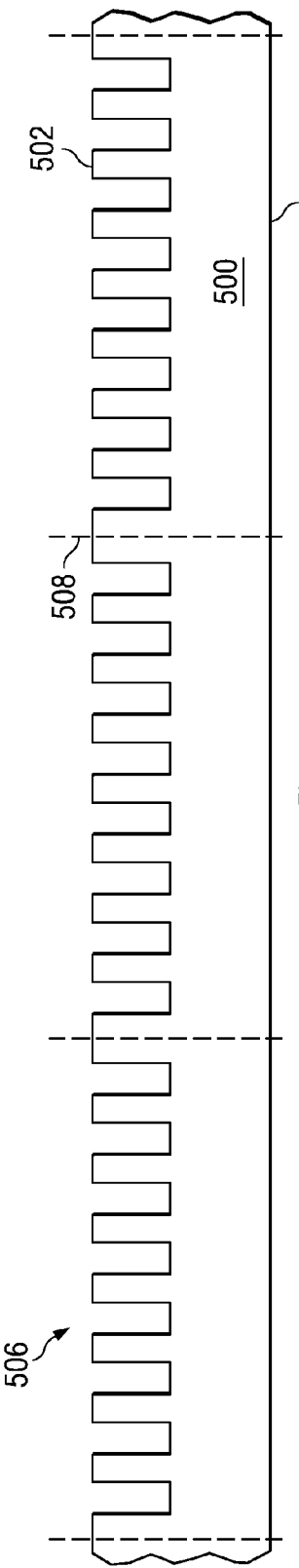
Figure 5C:
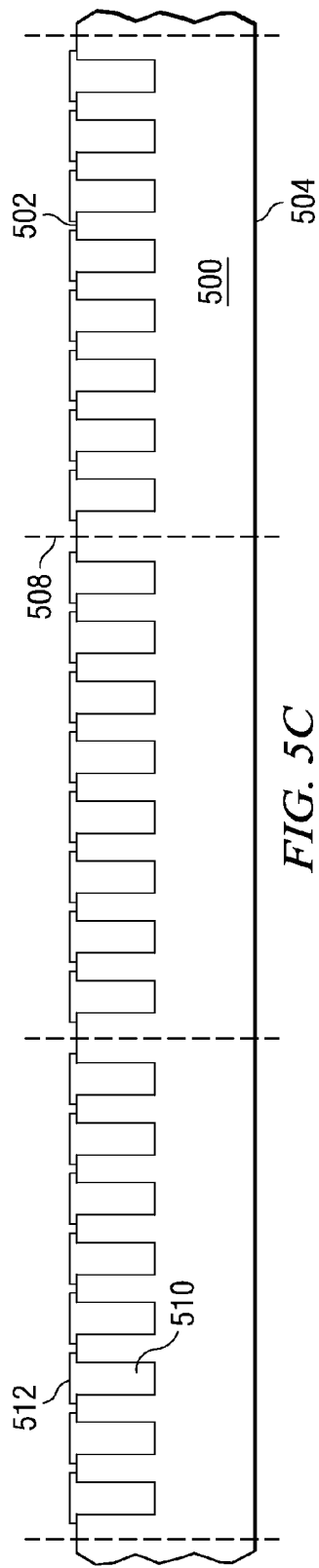
Figure 5D:
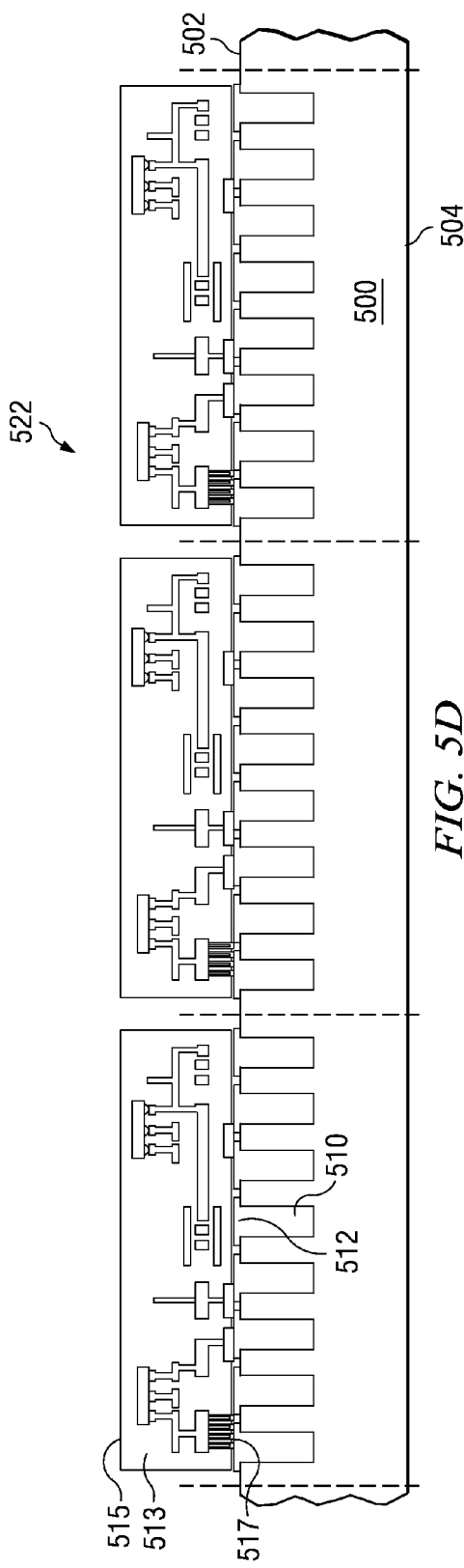
Figure 5E:
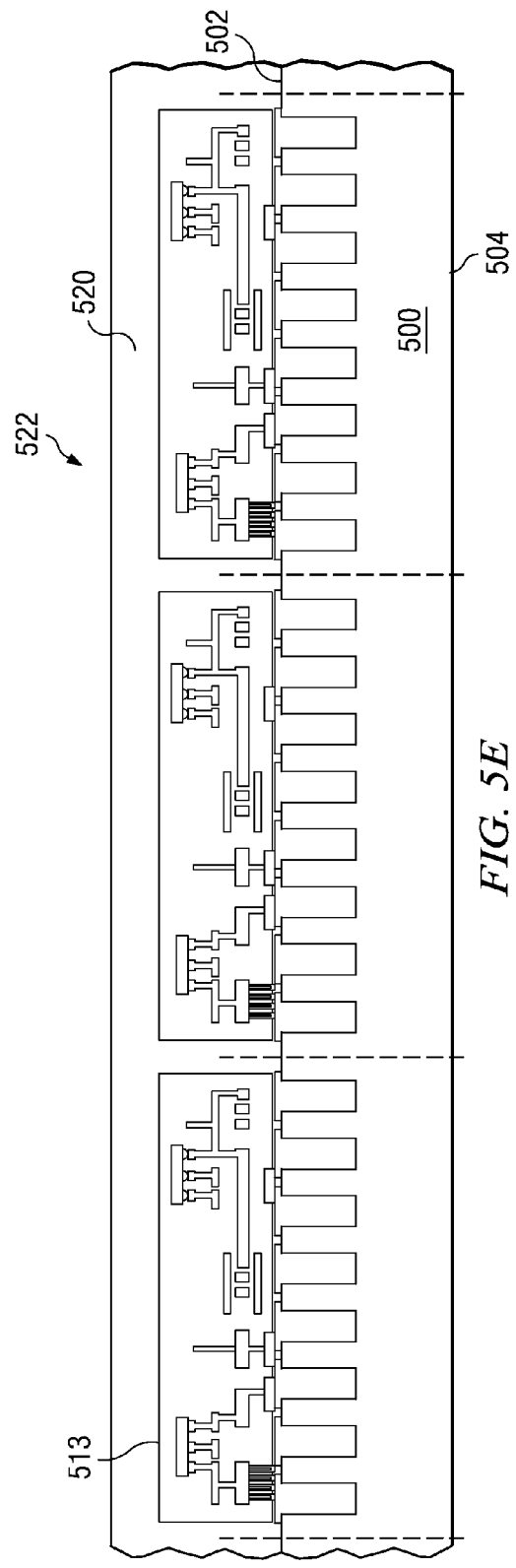

FIGS. 5A-5J illustrate cross-sectional views of a wafer level process for building a package similar to arrangement 450 of FIG. 4D. FIG. 5A depicts a wafer 500 with a top surface 502 and a bottom surface 504. Only a small portion of wafer 500 is shown. The dotted vertical lines indicate projected scribe lines 508. In the illustrated embodiment, substrate 500 can be made of a variety of suitable materials, such as silicon.

In FIG. 5B, the top surface 502 of wafer 500 is etched to form holes 506. This etching process may be performed using a variety of techniques, such as plasma etching. Afterwards, metal is deposited into the holes to form an electrical system. This deposition may be performed using any suitable method, such as electroplating. For example, a seed layer (not shown) may be deposited over top surface 502 of wafer 500. The seed layer may then be electroplated with a metal such as copper. The electroplating process can produce metal vias 510 and contact pads 512 on the top surface 502 of wafer 500.

In FIG. 5D, microsystems 513 are formed on the top surface 502 of wafer 500 using steps similar to those described in connection with FIGS. 2 and 3A-3L. In the illustrated embodiment, microsystems 513 do not have external contact pads formed on their top surfaces 515, as the top surfaces 515 will be overmolded in a later operation. In another embodiment, external contact pads are formed on top surfaces 515 to enable wafer level functional testing prior to overmolding. Microsystems 513 have external contact regions on their bottom surfaces 517, which are aligned with the contact pads 512 on the top surface 502 of wafer 500. This facilitates an electrical connection between the metal vias 510 and the interconnect layers within the microsystems 513.

In FIG. 5E, a suitable molding material 520 is applied over the microsystems 513 and the top surface 502 of the wafer 500. The molding process can be performed using a variety of suitable techniques and materials. As a result, a molded wafer structure 522 is formed. In some designs, the molding material 520 completely covers and encapsulates microsystems 513 and/or the entire top surface 502. The application of molding material 520 may provide additional mechanical support for microsystems 513, which may be useful when microsystems 513 are large.

Figure 5F:
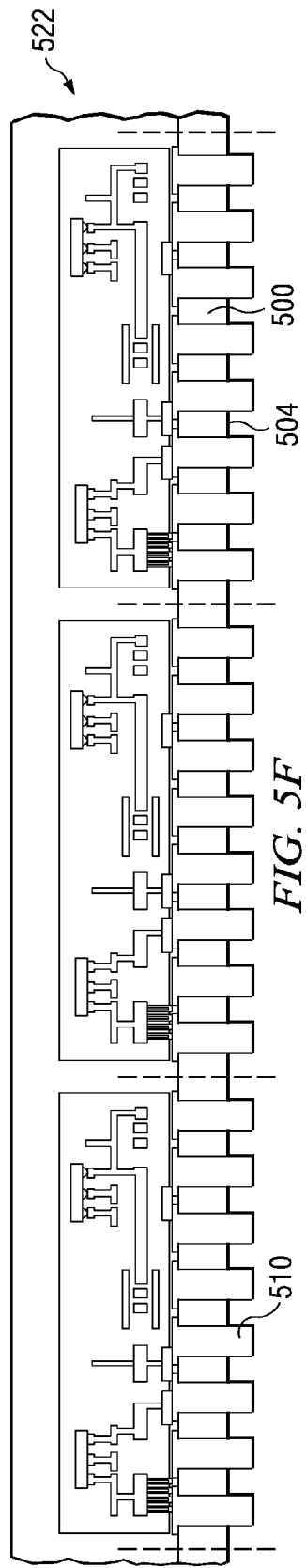
Figure 5G:
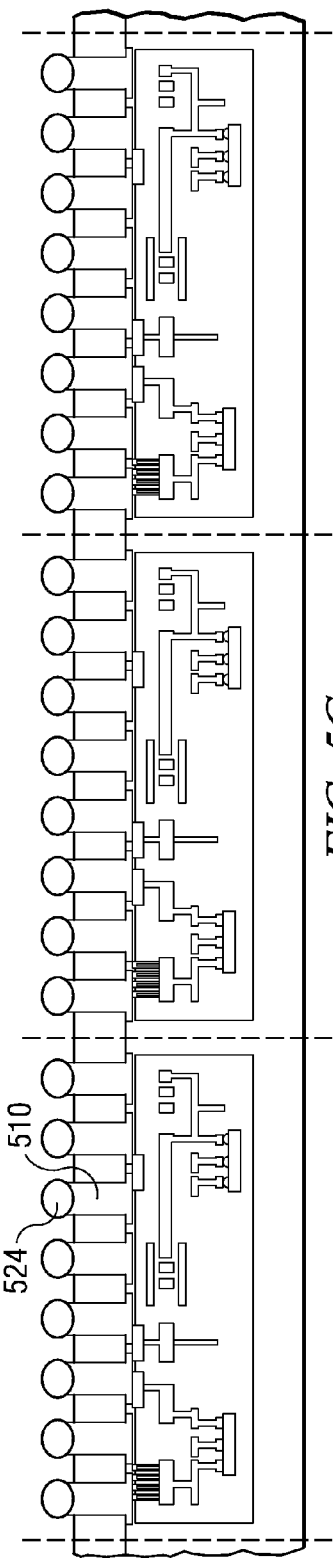
Figure 5H:
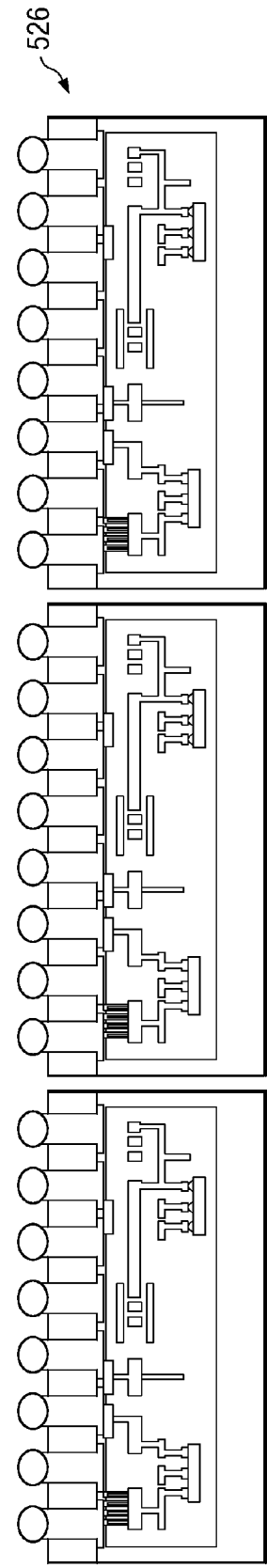

FIG. 5F depicts molded wafer structure 522 after the bottom surface 504 of wafer 500 has been partially removed using any of a range of suitable techniques, such as backgrinding. As a result, portions of metal vias 510 are exposed. In FIG. 5G, solder balls 524 are applied to the exposed portions of metal vias 510. In FIG. 5H, the molded wafer structure 522 is then singulated along projected scribe lines 508 to create individual package arrangements 526. The singulation process can be performed using a variety of appropriate methods, such as sawing or laser cutting.

Figure 6A:
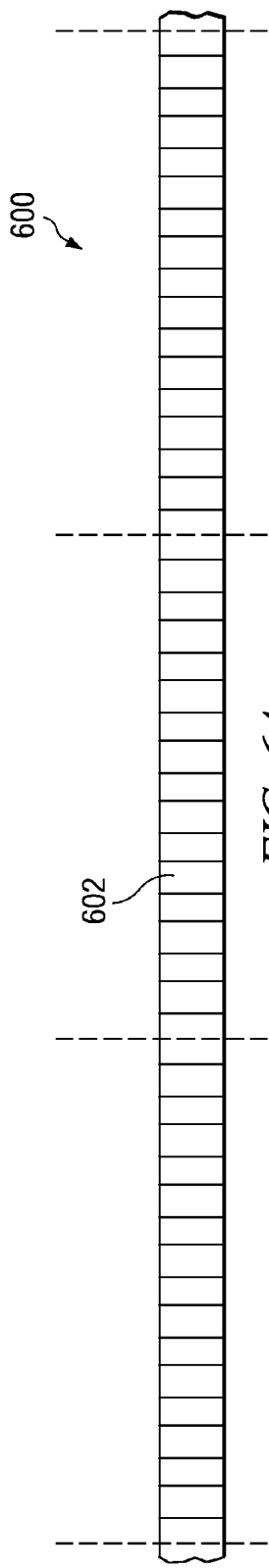
FIGS. 6A-6C illustrate selected steps in a wafer level process for packaging integrated circuits in accordance with another embodiment of the present invention.
Figure 6B:
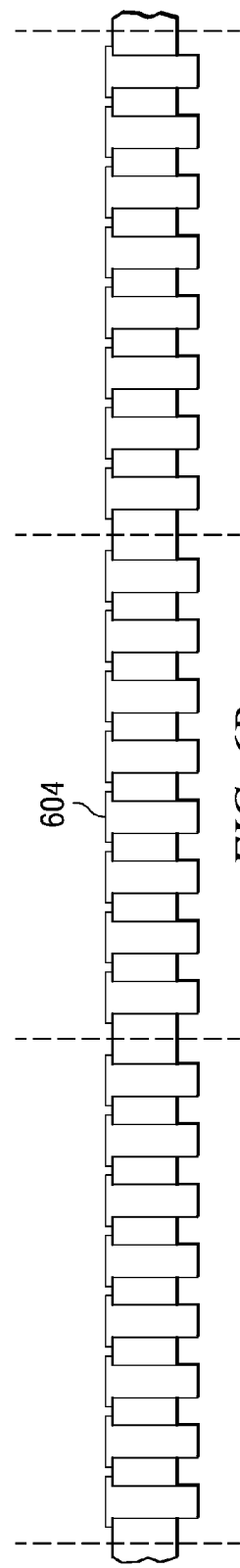
Figure 6C:
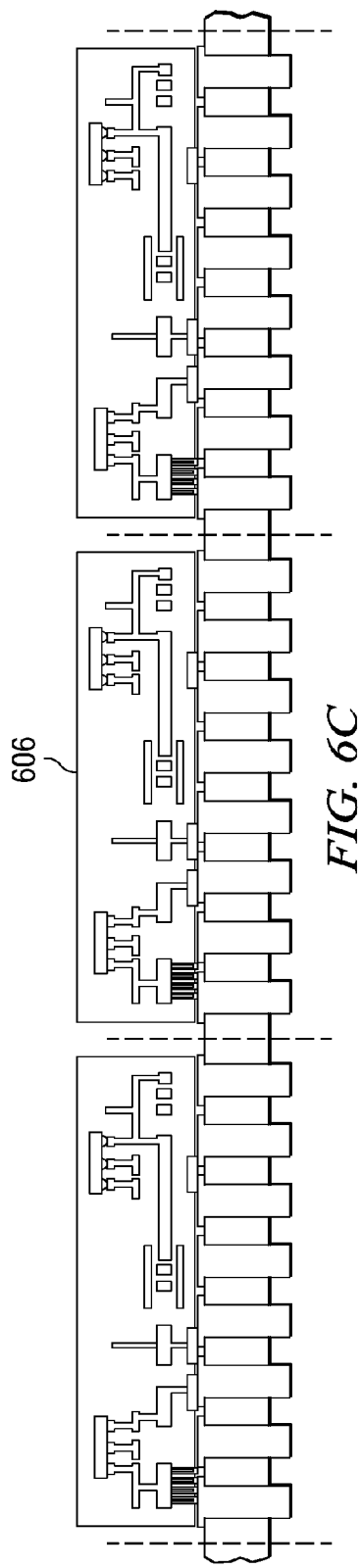

FIGS. 6A-6C illustrate cross-sectional views of a wafer level process for building a package according to another embodiment of the present invention. FIG. 6A shows a substrate 600 prefabricated with through holes 602. FIG. 6B illustrates the deposition of metal into the holes 602 to form metal vias 604. The deposition of metal can be performed using any suitable technique, such as electroplating. In some embodiments, the substrate 600 comes prefabricated with through holes 602 and/or metal vias 604, thus eliminating one or more processing steps. In FIG. 6C, microsystems 606 are formed over the metal vias 604 and the substrate 600 using any of the aforementioned techniques. Afterward, solder bumping and singulation can be performed, as shown in FIGS. 5G and 5H. The illustrated embodiment can include various features like those described in connection with FIGS. 5A-5H.

Figure 7A:
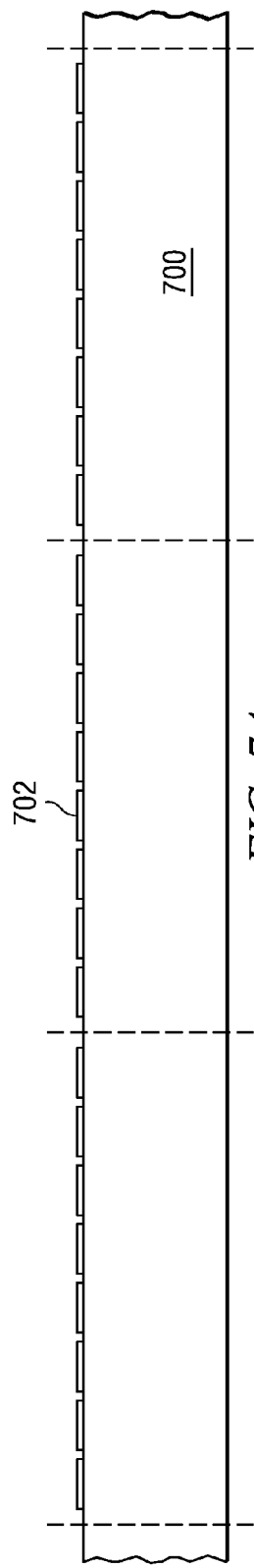
FIGS. 7A-7C illustrate selected steps in a wafer level process for packaging integrated circuits in accordance with yet another embodiment of the present invention.
Figure 7B:
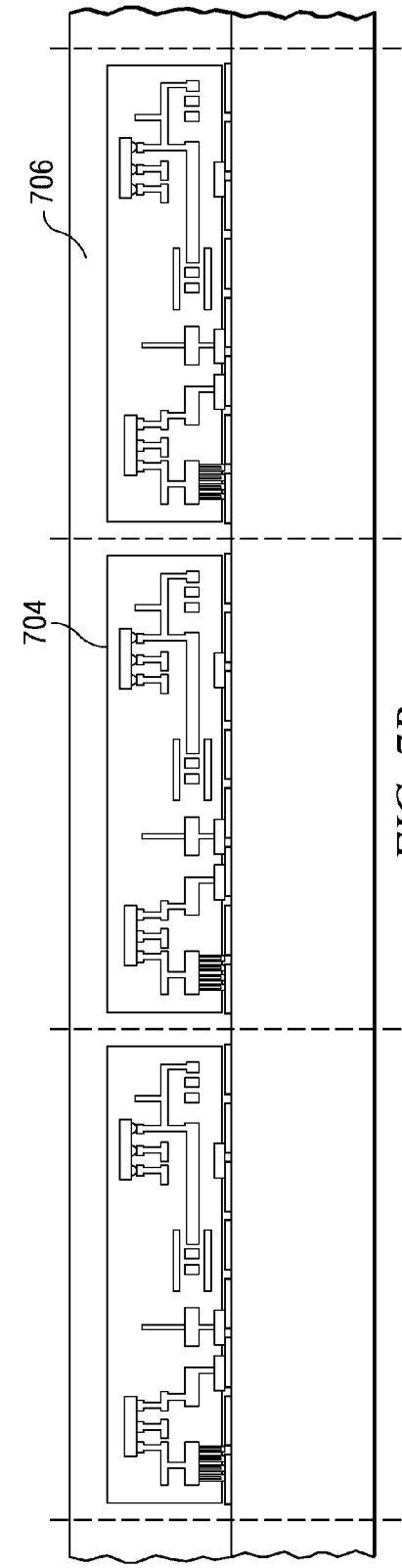
Figure 7C:
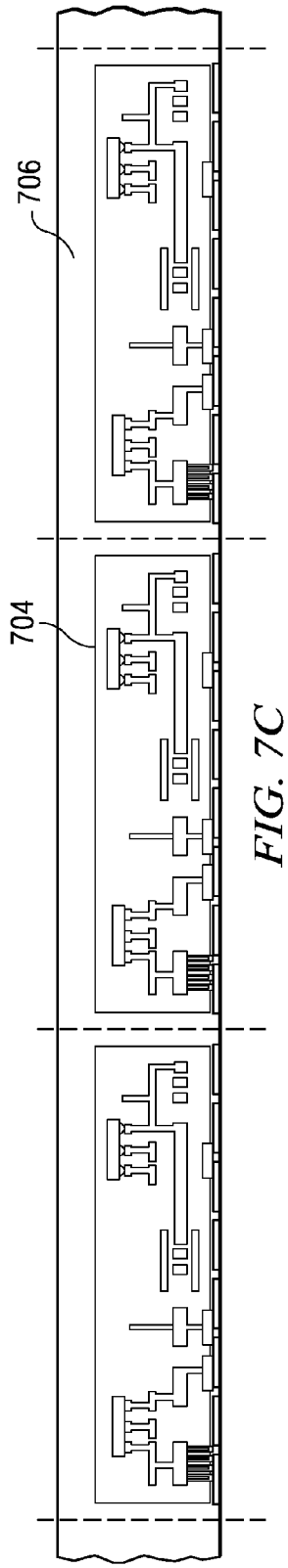

FIGS. 7A-7C illustrate cross-sectional views of a wafer level process for building a package according to another embodiment of the present invention. Initially, a substrate 700 is provided. Copper pads 702 are then formed over the top surface of the substrate 700. In FIG. 7B, microsystems 704 are formed over copper pads 702 and substrate 700 using any of the aforementioned techniques. The microsystems 704 and the top surface of the substrate 700 are then encapsulated in a suitable molding material 706. The substrate 700 is then entirely ground away or otherwise removed in FIG. 7C. Afterward, solder bumps can be attached to copper pads 702. The illustrated embodiment can include various features like those described in connection with FIGS. 5A-5H.

Additional embodiments of the present invention are illustrated in FIGS. 8-10. These embodiments pertain to integrated circuit packages in which one or more integrated circuits is embedded within a substrate e.g., a silicon substrate. The embedded integrated circuit is covered with a photo-imageable epoxy layer. An interconnect layer is formed over the epoxy layer and is electrically coupled with the integrated circuit through one or more vias in the epoxy layer.

Embedding one or more integrated circuits in the substrate can offer various advantages. For example, various embodiments of the present invention involve embedded integrated circuits that can use the substrate as a thermal heat sink, an electrically conductor, and/or a medium for optical communication. When a silicon wafer is used as the substrate, the similarity in the coefficients of thermal expansion of an embedded integrated circuit and a silicon substrate can help reduce the risk of delamination. In some implementations the embedding of an integrated circuit in the substrate instead of the epoxy layer can help minimize the thickness of the epoxy layer and reduce the size of the package.

Figure 8A:
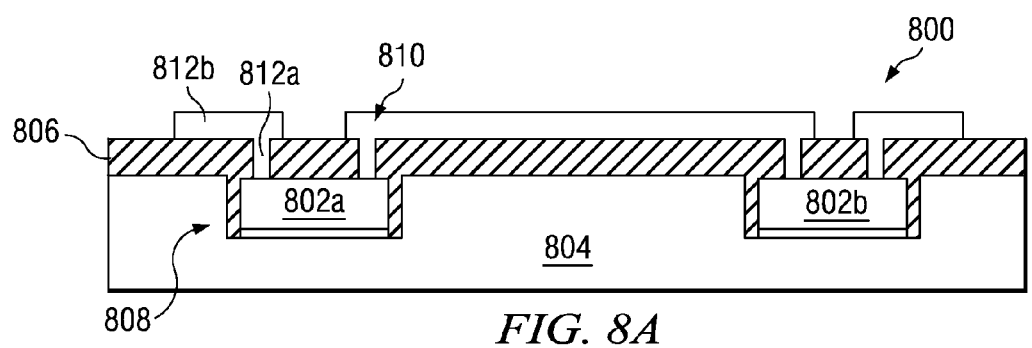
FIGS. 8A-8B illustrate diagrammatic cross-sectional views of packages that each include a substrate with embedded integrated circuits according to various embodiments of the present invention.
Figure 8B:
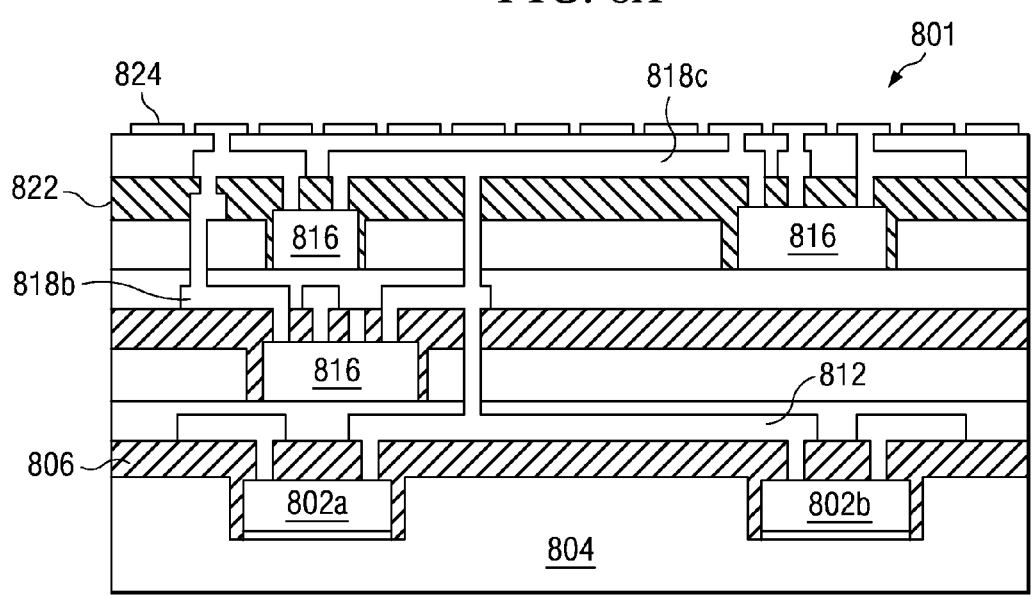

Referring now to FIGS. 8A and 8B, various examples of integrated circuit packages that include substrates with one or more embedded integrated circuits are described. FIG. 8A illustrates an integrated circuit package 800, which includes a substrate 804, integrated circuits 802, a layer of epoxy 806 and an interconnect layer 812. The substrate 804 is preferably a silicon wafer, which is easily handled by existing semiconductor packaging equipment. Depending on the intended use of the package 800, however, other suitable materials (e.g., glass, quartz, etc.) can be used. Integrated circuits 802 are positioned within cavities 808 in a top surface of the substrate 804. The active face of the integrated circuits 802 and the top surface of the substrate 804 are covered with a layer of epoxy 806. The epoxy layer 806 is made of a planarizing, photo-imageable, epoxy such as SU-8. The interconnect layer 812 is formed over the epoxy layer 806. The interconnect layer 812 includes conductive traces 812b and conductive vias 812a, which extend into openings 810 in the epoxy layer 806 and are electrically coupled with I/O pads on the active faces of the integrated circuits 802. In various implementations where the addition of more epoxy layers, integrated circuits and electrical components are not contemplated, a dielectric layer can be applied over the interconnect layer 812. Bonding pads can be formed on the outside of the package 800 that are electrically coupled with the integrated circuits 802 and the interconnect layer 812 through openings in the dielectric layer.

FIG. 8B illustrates another embodiment of the present invention that involves positioning additional epoxy layers, integrated circuits and interconnect layers over the substrate 804. The integrated circuit package 801 includes multiple, adjacent layers of epoxy 822, interconnect layers 818 and integrated circuits 816 that are stacked over the interconnect layer 812, epoxy layer 806, integrated circuits 802 and substrate 804. Integrated circuits 816 are each positioned in at least one of the epoxy layers 822. Interconnect layers 818 are interspersed between various integrated circuits 816 and epoxy layers 822. The interconnect layers 818 electrically connect various integrated circuits 802 and 816 with one another and with I/O pads 824 that are formed on the top surface of the integrated circuit package 801.

It should be appreciated the FIGS. 8A and 8B represent particular embodiments from which many variations are possible. For example, there can be one or almost any number of integrated circuits positioned within or on the substrate 804. The positioning of the conductive vias and traces, the placement and dimensions of the cavities and/or the thickness of the interconnect layers and epoxy layers can differ from what is shown in the figures. Additionally, any of the features and arrangements described in connection with FIGS. 1 through 7C can be combined with or be used to modify almost any aspect of FIGS. 8A and 8B.

Figure 9A:
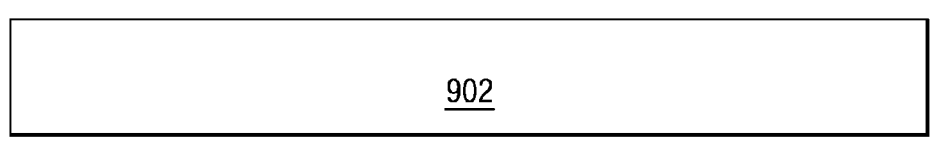
FIGS. 9A-9G illustrate selected steps in a wafer level process for forming packages that each include a substrate with embedded integrated circuits according to another embodiment of the present invention.

Referring to FIGS. 9A-9G, an exemplary method of forming the integrated circuit packages of FIGS. 8A and 8B is described. In FIG. 9A, a substrate 902 is provided. In a preferred embodiment, the substrate 902 is a silicon wafer, as this can help maximize the compatibility of the operations of FIGS. 9A-9F with existing semiconductor wafer-based processing equipment. In alternative embodiments, substrate 902 can be made from a wide variety of materials, including silicon, glass, steel, G10-FR4, quartz, etc., depending on the needs of a particular application.

Figure 9B:
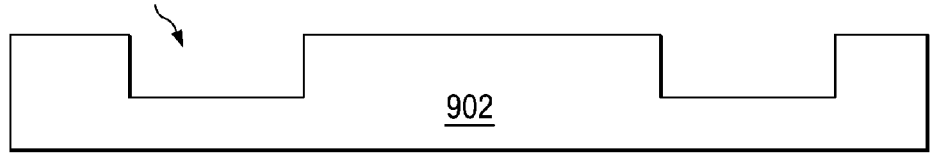
Figure 9C:
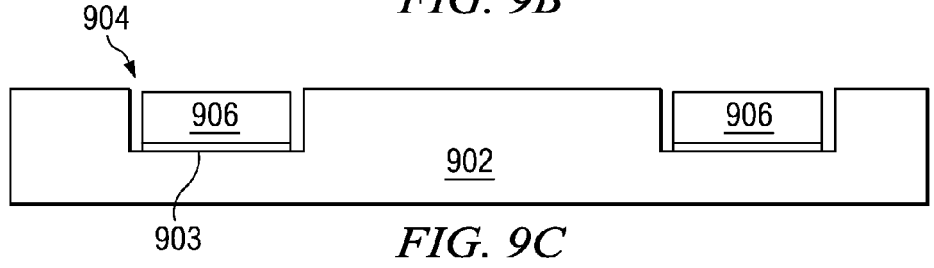

In FIG. 9B, cavities 904 are formed in the substrate 902. Cavities 904 can be formed using wet or plasma etching, although other suitable techniques can be used as well. The chemistries used in the etching process and the crystalline structure of the silicon in the substrate 902 can help control the angle of the sidewalls for cavity 904. For example, it has been found that a silicon crystal structure of [1,1,0] can help produce a straighter sidewall and/or help form a sidewall that is approximately perpendicular to the bottom surface of its corresponding cavity. A die attach adhesive 903 can be applied to the bottom of the cavity 904 to help adhere the integrated circuit 906 to the bottom surface of the cavity 904, as shown in FIG. 9C. In an alternative embodiment, the die attach adhesive 903 is applied to a back surface of the integrated circuit 906, either individually or on the wafer level, prior to the placement of the integrated circuit 906 in the cavity 904. Depending on the needs of a particular application, the die attach adhesive can be electrically conductive or non-conductive. In some embodiments, both types of adhesive are used in the same package such that one integrated circuit is electrically coupled through its bottom surface with an electrically conductive substrate and another integrated circuit is electrically insulated from the substrate. (Various applications for an electrically conductive substrate are discussed below.)

Figure 9D:
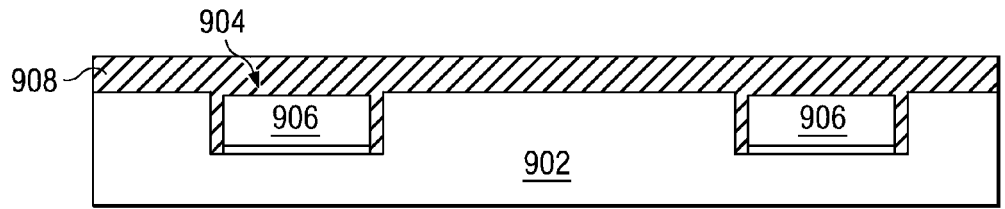

In FIG. 9D, a layer of planarizing, photo-imageable epoxy 908 is deposited over the cavities 904, the substrate 902 and the integrated circuits 906. The epoxy layer 908 is preferably SU-8, but other suitable materials can also be used. The epoxy layer can extend over and come in direct contact with the active surface of the integrated circuit 906 and can fill in the cavity 904 in the substrate 902. As noted earlier, one of the advantages of using a photo-imageable epoxy such as SU-8 is the degree of control that can be exercised over it using photolithographic techniques.

Figure 9E:
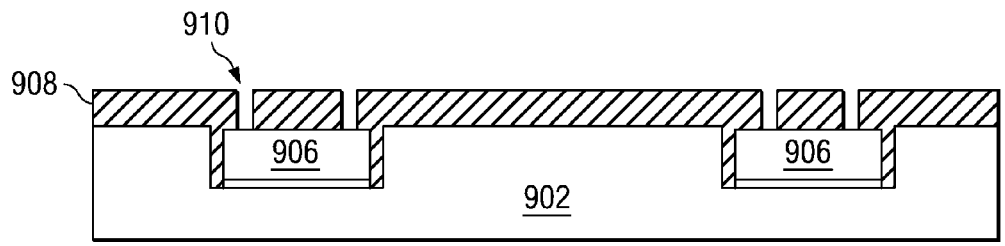

In FIG. 9E, one or more openings 910 are formed in the epoxy layer 908. The openings 910 can be created in a wide variety of ways known to persons of ordinary skill in the field of semiconductor processing. For example, the epoxy layer 908 can be photolithographically patterned and portions of the epoxy layer 908 can be dissolved using a developer solution. The openings 910 can expose I/O pads on the active surfaces of the integrated circuits 906 embedded within the epoxy layer 908.

Figure 9F:
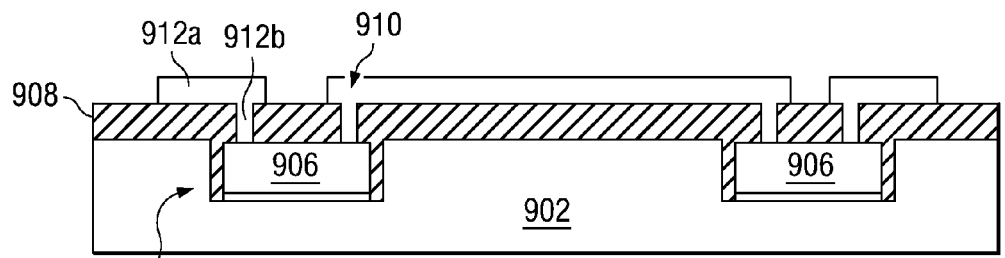

FIG. 9F illustrates the formation of an interconnect layer 912, which can be performed using various suitable techniques that are known in the art. One approach, which can resemble the steps described in connection with FIGS. 3F-3J, involves depositing a seed layer and a photoresist layer, patterning the photoresist and electroplating a metal to form conductive traces 912a and conductive vias 912b in the openings 910. In various embodiments, the interconnect layer 912 electrically connects multiple integrated circuit dice 906 that are embedded in the substrate 902.

Figure 9G:
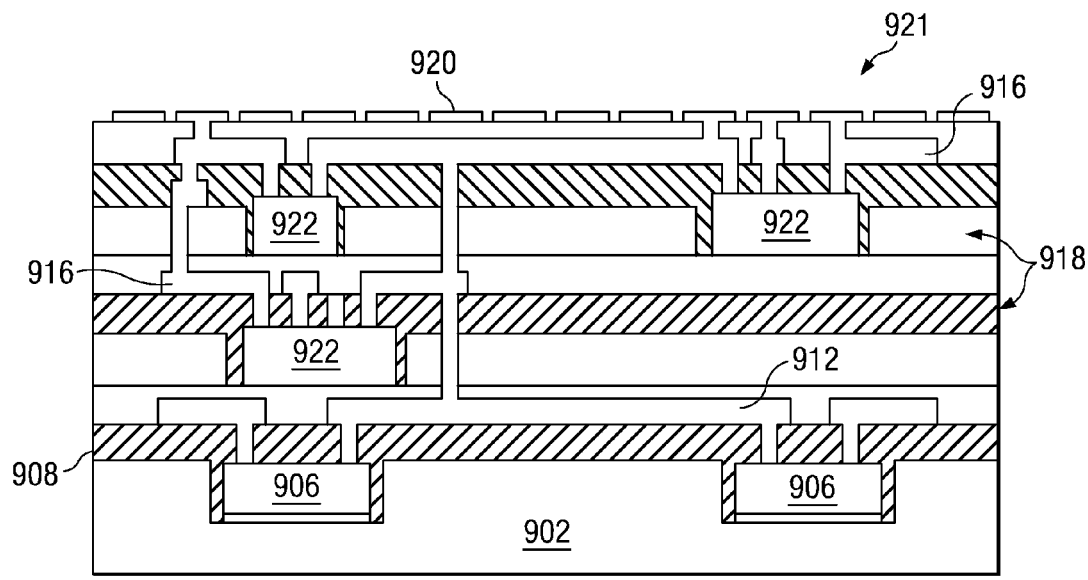

Afterward, additional epoxy layers 918, integrated circuits 922 and/or interconnect layers 916 can be formed over the substrate 902, integrated circuits 906, epoxy layer 908 and interconnect layer 912. These layers and components can be arranged in a wide variety of ways and any of the arrangements and features discussed in connection with FIGS. 1-7C can be used to modify any aspect of the illustrated embodiment. For example, the one or more interconnect layers 912 and/or 916 can be used to electrically connect the integrated circuits 906 positioned within the substrate 902 with any or all of the integrated circuits 922 that are embedded within the epoxy layers 918. Thermal pipes, which can be suitable or unsuitable for transmitting electrical signals, can extend from the substrate-based integrated circuit dice 906 to any exterior surface of the integrated circuit package 921. As described earlier, various passive and active devices, thermal pipes, heat sinks, sensors etc. can be formed or placed in almost any location of the integrated circuit package 921 (e.g., in the substrate 902, on the substrate 902, embedded between epoxy layers 918, etc.) The substrate 902 can also be subjected to backgrinding or any other operation suitable for reducing the thickness of the substrate 902. FIG. 9G illustrates an example of the integrated circuit package of FIG. 9F after additional epoxy layers, interconnect layers and integrated circuits have been applied over the substrate 902, integrated circuits 906, epoxy layer 908 and interconnect layer 912.

Figure 10A:
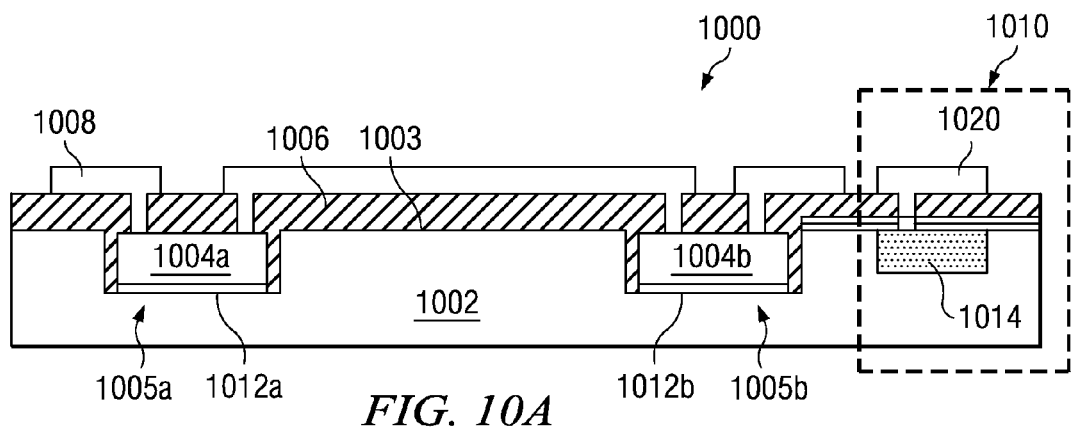
FIGS. 10A-10D illustrate diagrammatic cross-sectional views of package arrangements according to various embodiments of the present invention.

Additional embodiments of the present invention, each of which also include a substrate with one or more embedded integrated circuits, are illustrated in FIGS. 10A-10D. FIG. 10A illustrates integrated circuit package 1000, which includes an electrically and thermally conductive substrate 1002 with embedded integrated circuits 1004, a planarizing, photo-imageable epoxy layer 1006 and an interconnect layer 1008. The integrated circuit package 100 can be formed using any of the techniques described in connection with FIGS. 9A-9F.

Integrated circuit 1004b is mounted onto a bottom surface of cavity 1005 in the substrate 1002 using an electrically conductive adhesive 1012b. As a result, integrated circuit 1004b is electrically coupled with the substrate 1002 and/or can use the substrate 1002 to dissipate heat to an exterior surface of the package. Some implementations also include an integrated circuit 1004a that is electrically insulated from the conductive substrate 1002 by a non-conductive adhesive 1012a. In the illustrated embodiment, only two integrated circuits are shown, but fewer or more integrated circuits that are each electrically coupled or insulated from the substrate 1002 can be positioned within the substrate 1002.

In various embodiments, the substrate 1002 can serve as a conduit for an electrical ground connection. Package 100 includes a ground interconnect 1020, which is formed over and extends through the epoxy layer 1006 and is electrically coupled with a ground contact region 1014 in the substrate 1002. Ground interconnect 1020 is made of an electrically conductive material, such as copper, and may have been formed at least partly during the formation of the interconnect layer 108, as described earlier in connection with FIG. 9F.

Both the ground contact region 1014 in the substrate 1002 and other portions of the substrate 1002 are made of silicon and are doped to improve their electrical conductivity. In order to facilitate an electrical connection between substrate 1002 and the ground interconnect 1020, the ground contact region 1014 has a substantially higher doping concentration than one or more other portions of the substrate 1002. In various implementations the substrate 1002 is made of a p-type semiconductor material and the ground contact region 1014 is a p++ doping region, although the substrate 1002 and the ground contact region 1014 can be doped using any suitable materials and/or concentrations known by persons of ordinary skill in the art. As a result, when the ground interconnect 1020 is electrically grounded, the integrated circuit 1004b, the substrate 1002 and the ground contact region 1004 are electrically coupled with the ground interconnect 1020 and are likewise electrically grounded.

Figure 10B:
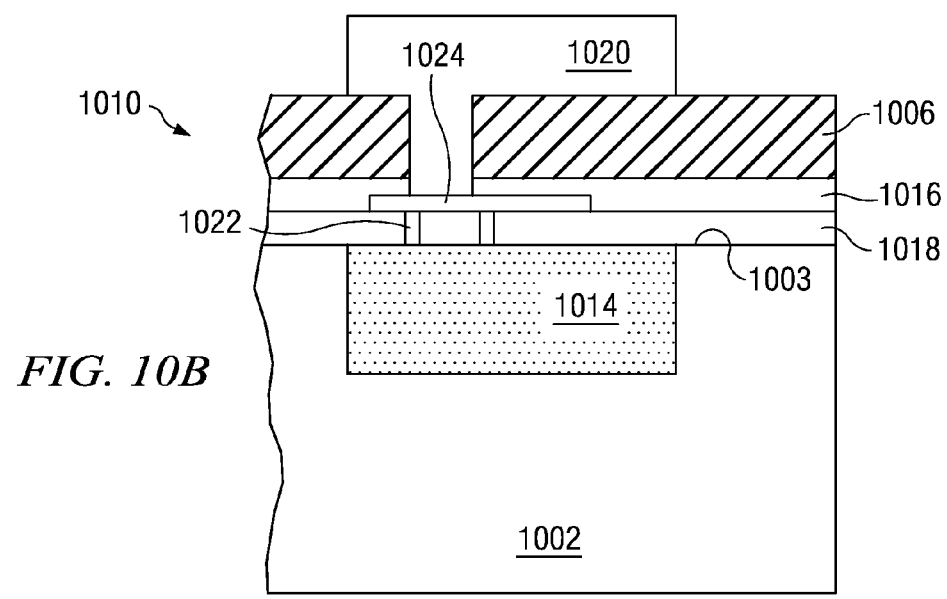

FIG. 10B provides an enlarged view of region 1010 of FIG. 10A according to one embodiment of the present invention. The figure includes substrate 1002 with ground contact region 1014, interlayer dielectric 1016, passivation layer 1018, electrically conductive plugs 1022, electrical interconnects 1024 and 1020, epoxy layer 1006 and ground interconnect 1020. Various techniques known to persons of ordinary skill in the field of semiconductor manufacturing can be used to deposit, pattern and/or develop interlayer dielectric 1016 and passivation layer 1018 and form plugs 1022 and electrical interconnect 1024. Plugs 1022 and electrical interconnect 1024 can be made from various suitable electrically conductive materials, including tungsten and aluminum respectively. Epoxy layer 1006 and interconnect 1020 can be formed using various techniques, including those described in connection with FIGS. 9D-9F.

The techniques used to form interlayer dielectric 116 and passivation layer 1018 of FIG. 10B can be integrated into the techniques used to form cavities 1005 of FIG. 10A. For example, prior to the formation of cavities 1005, interlayer dielectric 1016 can be deposited across the top surface 1003 of substrate 1002. The interlayer dielectric can be patterned and etched not only to create space for the plugs 1022, but also to form a mask for the formation of cavities 1005 in substrate 1002. Such an approach can help reduce the number of processing steps used to fabricate the integrated circuit package 1000.

Figure 10C:
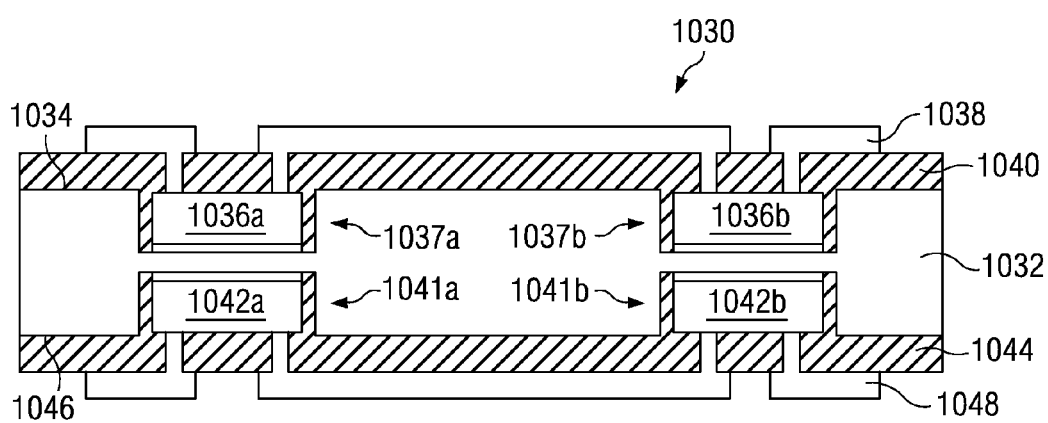

Another embodiment of the present invention is illustrated in FIG. 10C. FIG. 10C includes an integrated circuit package 1030 with integrated circuits, planarizing, photo-imageable epoxy layers and interconnect layers formed on opposing sides of a substrate. In the illustrated embodiment, integrated circuits 1036, epoxy layer 1040 and interconnect layer 1038 are formed over the top surface 1034 of substrate 1032. Integrated circuits 1042, epoxy layer 1044 and interconnect layer 1046 are formed over the opposing bottom surface 1046 of the substrate 1032. One approach to forming the integrated circuit package 1030 is to apply various techniques discussed in connection with FIGS. 9A-9F on both the top and bottom surfaces of the substrate 1032.

A particular implementation of the integrated circuit package 1030 involves arranging integrated circuits to communicate with one another optically through an optically transparent substrate. In the illustrated embodiment, for example, integrated circuits 1036a and 1042a are aligned over one another and include optical devices, such as a laser diode, optical detector, etc. (In still another embodiment, optical devices such as an optical sensor, optical detector, laser diode, etc. may be used in place of integrated circuits 1036a and/or 1042a.) At least the portion of the substrate 1034 between integrated circuits 1036a and 1042a is optically transparent and is arranged to allow optical communication between integrated circuits 1036a and 1042a. The optically transparent substrate can be made of various materials, including glass and quartz. Some implementations involve a substrate 1032 that is entirely made of a single optically transparent material and/or has a uniform composition.

Another approach involves a substrate 1032 made of silicon. The silicon substrate 1032 can electrically insulate the integrated circuits 1036a and 1042a but allow them to communicate optically using, for example, ultraviolet light, which is capable of traveling through silicon.

Figure 10D:
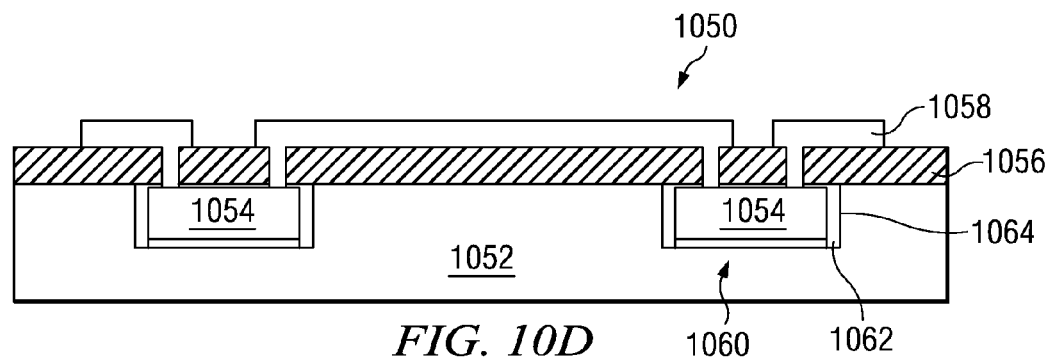

Still another embodiment of the present invention is illustrated in FIG. 10D. FIG. 10D shows an integrated circuit package 1050 with features for reducing stress on one or more integrated circuits 1054 embedded within the package substrate 1052. Integrated circuit package 1050 includes a substrate 1052 with cavities 1060, integrated circuits 1054, photo-imageable epoxy layer 1056 and interconnect layer 1058. Each cavity 1060 includes an air gap 1062 between a sidewall 1064 of the cavity 1060 and the integrated circuit 1054.

During testing and operation, the integrated circuit 1054 and package 1050 can be subjected to temperature cycling. Increases in temperature can cause the integrated circuit 1054 and other components of the package 1050 to expand. If the integrated circuit 1054 is encapsulated in a resilient material, such expansion can impose additional stress upon the integrated circuit 1054. The air gap 1062 can provide room for the integrated circuit 1054 to expand and thus help reduce such stress. Accordingly, epoxy layer 1056 covers but does not extend substantially into the cavity 1060.

Various approaches can be used to form the features of the integrated circuit package 1050. For example, the forming of cavities 1060 in the substrate 1052 and the placement of integrated circuits 1054 in the cavities 1060 can be performed as described earlier in connection with FIGS. 9A-9C. Afterward, a prefabricated sheet of photo-imageable epoxy, such as SU-8, can be applied such that it covers the cavities 1060 and the substrate 1052. In various embodiments, the epoxy layer 1056 is not spray- or spin-coated over the cavities 1060, but is instead laminated onto the substrate 1052. This approach helps to preserve air gaps 1062 between each integrated circuit 1054 and the sidewalls 1064 of the corresponding cavity 1060. The formation of openings in the epoxy layer 1056 and the interconnect layer 1058 can then proceed in a manner similar to the operations described in connection with FIGS. 9E-9F. For example, the epoxy layer 1056 can be patterned using photolithography, which can result in the curing and/or removal of portions of the epoxy layer 1056.

Referring next to FIGS. 11-18, methods and devices involving the formation of an antenna in an integrated circuit micro-module will be described. An antenna is a necessary component of almost any wireless communication system. For example, a typical cell phone may include multiple antennae for use with a variety of wireless protocols, including voice, data, Bluetooth, etc. A challenge for equipment manufacturers is fitting an antenna within a small, portable device in a manner that allows it to perform properly without taking up too much space.

One approach is to position an off-chip antenna on a printed circuit board within the device. Alternatively, the antenna can be incorporated into the casing of the device. These antenna designs, while effective for many applications, take up substantial amounts of real estate. In addition, the end user has the burden of creating a matching network that electrically connects the antenna with the device.

Another approach is to form one or more antennae directly within an integrated circuit package. Conventional package designs, however, can cause performance problems for an integrated antenna. An antenna communicates wireless signals by emitting electromagnetic radiation. When a radiating antenna is positioned too close to an electrically conductive material, some of the radiation of the antenna, instead of propagating through space, instead induces an electrical current in the conductor. In a typical integrated circuit package, the distance between a bottom silicon substrate and a top metal layer is only 15 microns or less. Although silicon is a fairly poor conductor, its close proximity to an antenna on the top metal layer of the package can substantially reduce the radiation efficiency of the antenna. A possible workaround is to use a substrate made of a high resistivity material. Such materials, however, tend to be more expensive. Moreover, in such designs the integrated circuit in the package may have to be designed explicitly for the high resistivity substrate, which reduces the flexibility of the package design.

Figure 11A:
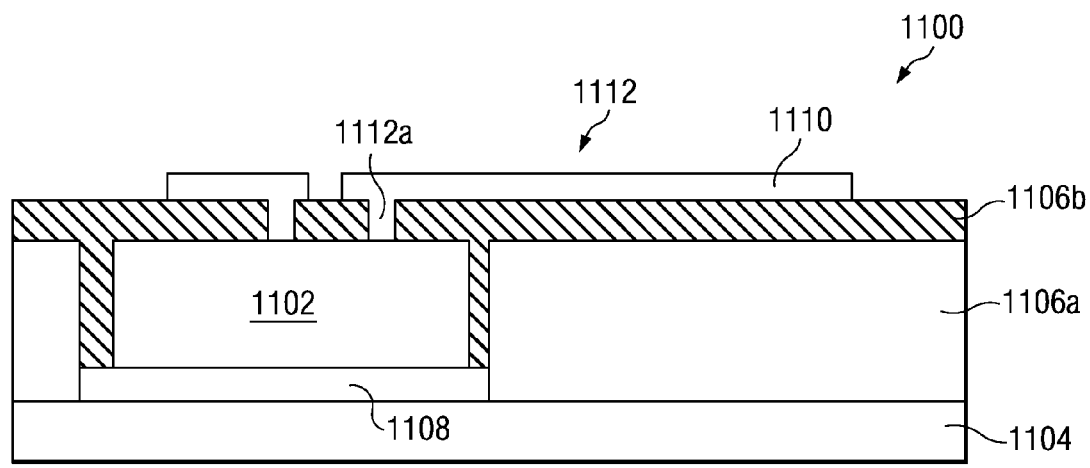
FIGS. 11A and 11B are diagrammatic side and top views of an integrated circuit package with an antenna according to a particular embodiment of the present invention.
Figure 11B:
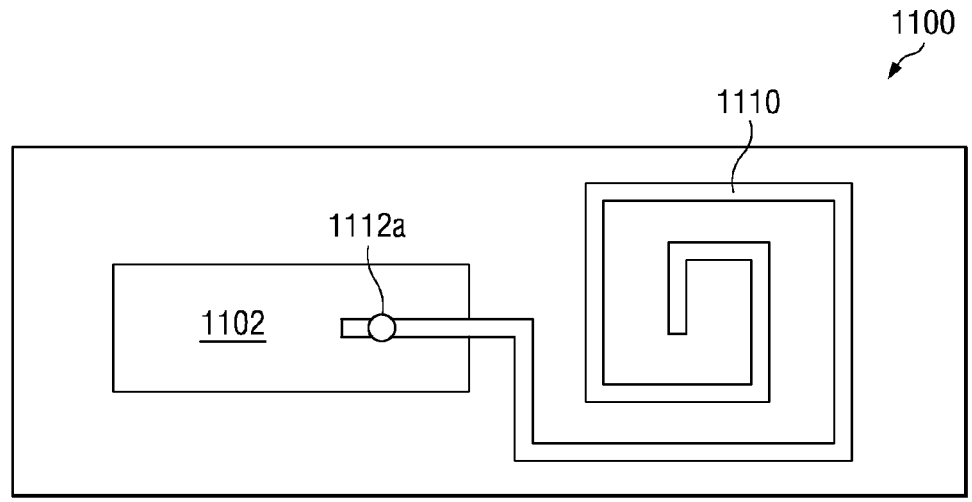

Various embodiments of the present invention address one or more of the above concerns. Referring next to FIGS. 11A and 11B, an integrated circuit package 1100 with an antenna 1110 according to a particular embodiment of the present invention will be described. The integrated circuit package 1100 includes a silicon substrate 1104, multiple layers of a photo-imageable, planarizing epoxy 1106a/1106b (e.g., SU-8), an integrated circuit 1102, an interconnect layer 1112, and an antenna 1110 that is electrically coupled to the integrated circuit 1102 through a via 1112a. The integrated circuit 1102 is embedded within the epoxy layers, which are stacked over the substrate 1104. The antenna is 1110 formed over one of the epoxy layers 1106b.

The epoxy layers 1106a/1106b are deposited sequentially to create a buffer between the antenna 1110 and the silicon substrate 1104. This arrangement offers various advantages. For one, since the distance between the top metal layer and the silicon substrate is increased relative to many conventional IC packages, interference from the substrate 1104 is reduced and the radiation efficiency of the antenna 1110 is substantially increased. In various embodiments, the distance between the substrate 1104 and the antenna 1110 and/or the thickness of the epoxy layers 1106a/1106b between the substrate and the antenna is approximately 100 microns or more. In a preferred embodiment, this distance and/or thickness is greater than approximately 140 microns. In still other embodiments, there is no large structure (e.g., with a thickness greater than 100-300 microns and/or that substantially exceeds the size and dimensions of a conventional conductive trace, via or solder ball) made entirely from electrically conductive or semiconductor materials that is within 100 microns of the antenna.

The exact distance between the antenna 1110 and the substrate 1104 can have a substantial impact on the radiation efficiency of the antenna 1110. For example, various tests were performed involving two types of test packages with silicon substrates and integrated 60 Ghz antennae that were arranged to radiate in the 57-64 Ghz band. The first type of package was formed using a conventional semiconductor manufacturing process and the antenna was separated from the underlying silicon substrate by a distance of approximately 10 microns. The radiation efficiency of the antenna in this type of package was approximately 19%. The second type of package was formed from layers of SU-8 in accordance with a particular embodiment of the present invention. In this package, the antenna was separated from the underlying silicon substrate by a distance of at least 145 microns. The radiation efficiency of the antenna jumped to approximately 68%. When the silicon substrate was replaced with a substrate made of non-conductive quartz, the radiation efficiency of the antenna rose to approximately 99%.

The use of photo-imageable, planarizing epoxy offers additional advantages. As discussed earlier with respect to other embodiments of the present invention, SU-8 and other suitable epoxy materials can be spin- or spray-coated and then shaped using known photolithographic techniques such that a wide variety of structures and devices can be embedded within the epoxy layers. Thus, the space between the antenna and the substrate can do more than merely act as a buffer between the antenna and the substrate. In various embodiments of the present invention, this space is filled with one or more interconnect layers that couple together multiple devices within the package and that are embedded between adjacent layers of epoxy. In still another embodiment, the space includes one or more ground planes that are positioned between epoxy layers and that help improve the signal integrity of signals sent from the integrated circuit to the antenna. A wide variety of structures, such as integrated circuits, thermal pipes and passive devices, can be positioned and/or formed directly within the space between the antenna and the substrate. Some of the techniques for forming such structures were described earlier in this application.

FIG. 11A depicts the antenna 1110 as exposed on the top of the package, although in some embodiments it may also be covered with one or more additional layers of planarizing, photo-imageable epoxy. Generally, the antenna 1110 is formed concurrently with other portions of the interconnect layer 1112 using electroplating or other suitable techniques. Although FIG. 11B, which is a diagrammatic top view of the integrated circuit package 1100, depicts the shape of the antenna 1110 as curled, it should be appreciated that the shape of the antenna may be circular, planar or any other suitable shape known by persons of ordinary skill in the art.

The integrated circuit package 1100 may be modified in a wide variety of ways, depending on the needs of a particular application. As depicted in FIG. 11A, the integrated circuit package 1100 includes only one die and two epoxy layers, but the present invention also contemplates embodiments with many more dice and epoxy layers. There may be multiple interconnect layers, any one of which may be embedded in a particular epoxy layer and/or sandwiched between adjacent epoxy layers. There may be additional devices or structures between and/or embedded within the epoxy layers, such as conductors, ground planes, resistors, inductors, conductive vias and traces, thermal pipes, heat sinks, sensors, etc.

Referring next to FIG. 12 and FIGS. 13A-13J, a method 1200 for forming the integrated circuit package of FIG. 11A will be described. These steps are similar to and can include any suitable feature from those described in connection with FIGS. 2 and 3A-3K, which also relate to the formation of an integrated circuit package with layers of planarizing, photo-imageable epoxy. It should appreciated that various steps of FIG. 12 may be repeated, reordered and/or may be performed concurrently.

Figure 13A:
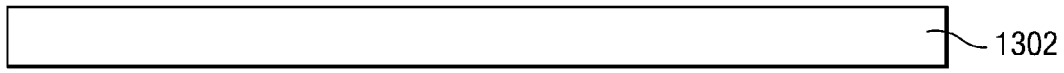
FIGS. 13A-13J are diagrammatic side views of an integrated circuit package that is being formed using the steps of the method illustrated in FIG. 12.
Figure 13B:

Referring initially to FIGS. 13A and 13B, a first layer of planarizing, photo-imageable epoxy 1304a is deposited onto a substrate 1302 (step 1202.) The epoxy may be applied using spray- or spincoating, sheet lamination, or other suitable operations. The first epoxy layer 1304a may be formed using one or more than one such operation.

Typically, the substrate 1302 is formed from a semiconductor material such as a silicon wafer, but any suitable material that provides mechanical support for the rest of the manufacturing process may be used, including silicon, G10-FR4 and quartz. High-resistivity silicon may also be used, although it tends to be substantially more expensive than standard silicon. An advantage of high-resistivity silicon, however, is that it can be significantly less lossy then standard silicon.

Figure 12:
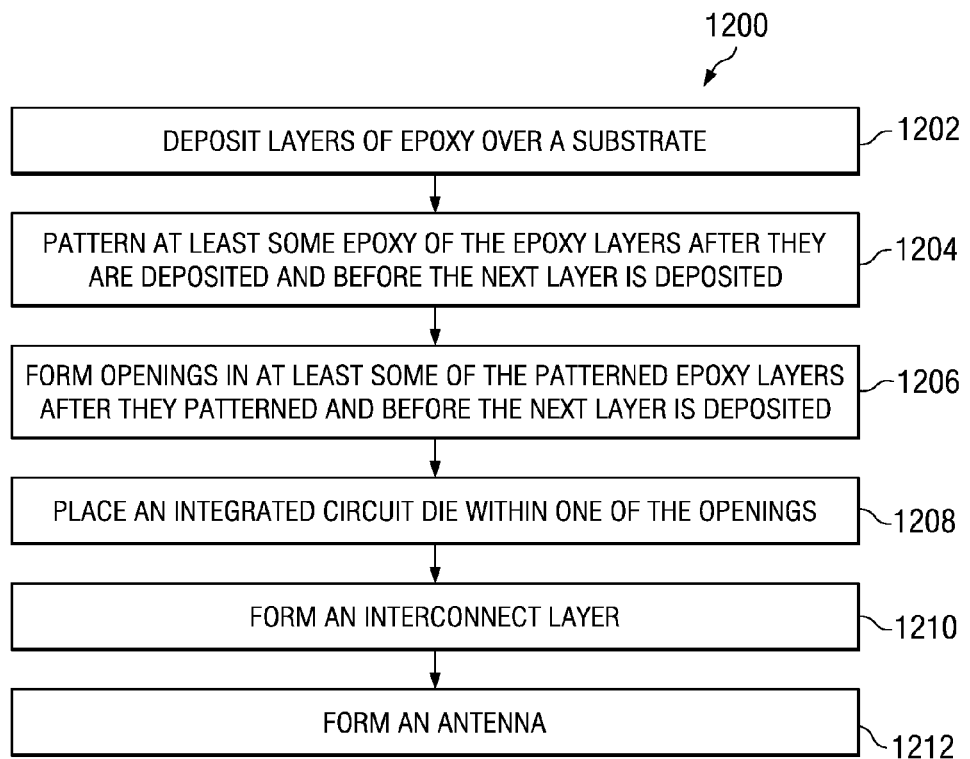
FIG. 12 is a flow diagram illustrating a method of forming a package with an integrated antenna according to a particular embodiment of the present invention.

In step 1204 of FIG. 12, the first epoxy layer 1304a is patterned using conventional photolithographic techniques. In one embodiment, a mask is used to selectively expose portions of the first epoxy layer 1304a. The exposure can be followed by a baking operation. These operations can cause the exposed portions of the first epoxy layer 1304a to crosslink. During the photolithographic process, exposed portions of the first epoxy layer 1304a may be cured, partially cured (e.g., B-staged) or otherwise altered or hardened relative to the unexposed portions to facilitate later removal of unexposed portions of the epoxy.

Figure 13C:
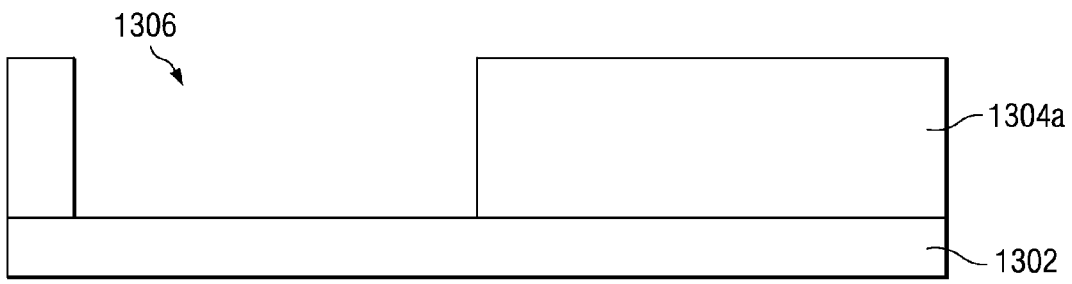

In step 1206 of FIG. 12 and FIG. 13C, unexposed portions of the first epoxy layer are removed to form one or more openings 1306 in the first epoxy layer 1304a. This removal process can be performed in a variety of ways. For example, the epoxy layer can be developed in a developer solution, resulting in the dissolution of the unexposed portions of the layer. A hard bake can be performed after the developing operation.

Figure 13D:
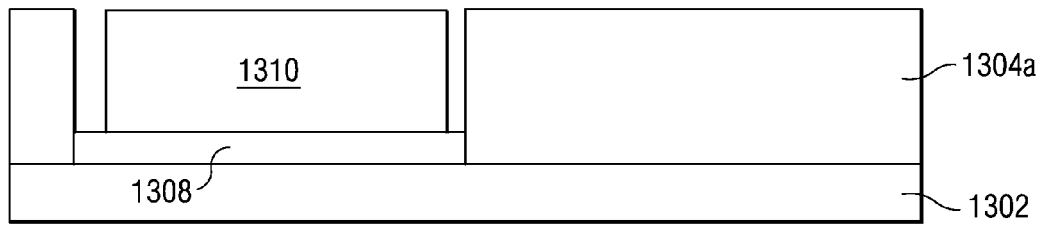

In step 1206 of FIG. 12 and FIG. 13D, an integrated circuit 1310 is placed in the opening 1306 and mounted on the substrate using a die attach 1308. The integrated circuit 1310 may be configured in a variety of ways. For example, the integrated circuit may be a bare or flip chip die, or it could have a BGA, LGA and/or other suitable pinout configuration. In the illustrated embodiment, the thickness of the integrated circuit 1310 is less than the thickness of the epoxy layer in which it is initially embedded, although in other embodiments, the die may be substantially the same thickness, or thicker than the epoxy layer in which it is initially embedded. The active face of the integrated circuit 1310 may face up or down.

Figure 13E:
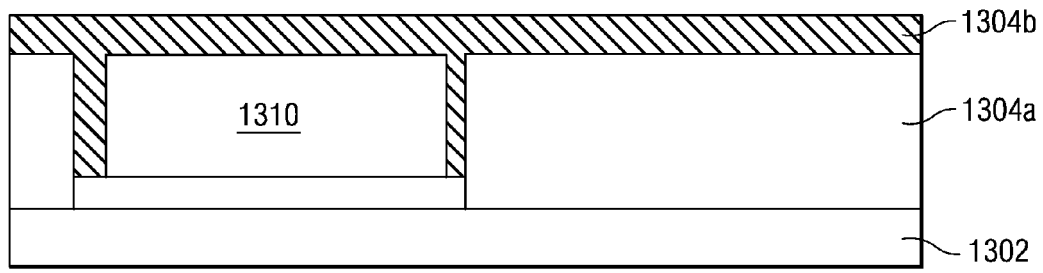

After the integrated circuit 1310 has been positioned in the opening and attached to the substrate, a second layer of epoxy 1304b is applied over the integrated circuit and the epoxy layer (step 1202 of FIG. 12) as illustrated in FIG. 13E. Like the first epoxy layer 1304a, the second epoxy layer 1304b may be deposited using any suitable method, such as spin coating. In the illustrated embodiment, the second epoxy layer 1304b is directly over, immediately adjacent to and/or in direct contact with the integrated circuit 1310 and the second epoxy layer 1304b, although other arrangements are also possible. The second epoxy layer 1304b may completely or partially cover the active surface of integrated circuit.

Figure 13F:
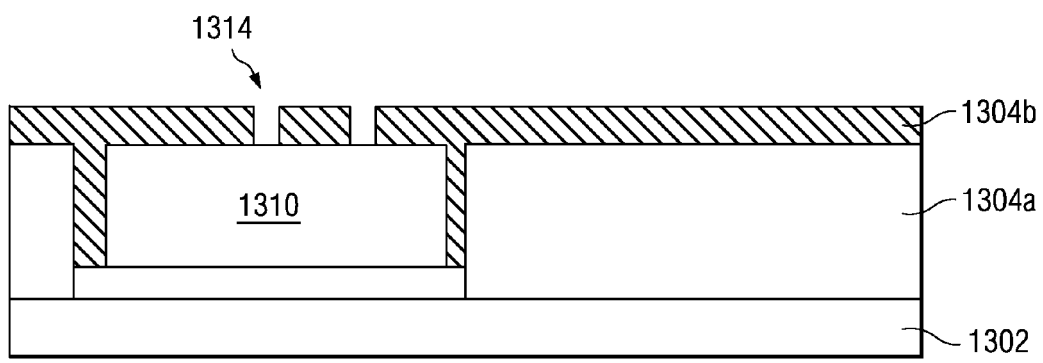

After the second epoxy layer 1304b has been applied, it is patterned and developed using any suitable techniques (steps 1204 and 1206), which would typically be the same techniques used to pattern the first epoxy layer 1304a. In the illustrated embodiment, via openings 1314 are formed over the integrated circuit 1310 to expose I/O bond pads (not shown) on the active surface of the integrated circuit. The resulting structure is illustrated in FIG. 13F.

Figure 13G:
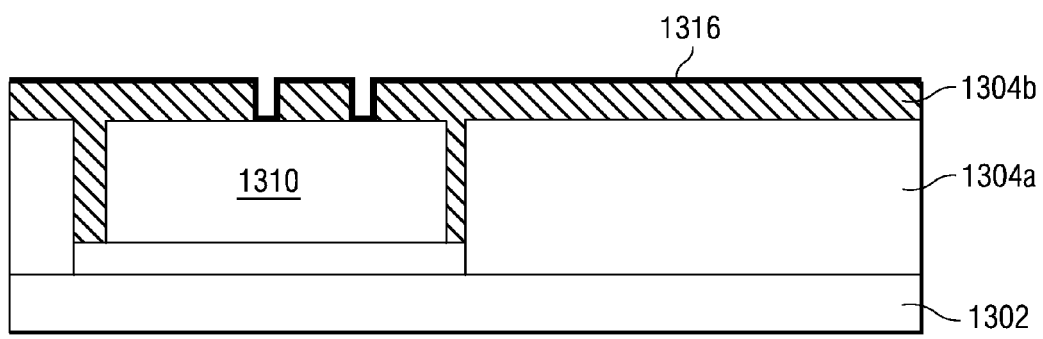

After any appropriate via openings have been formed, a seed layer 1316 is deposited over the openings 1314 and the second epoxy layer 1304b, as shown in FIG. 13G. The seed layer 1316 can be made of various suitable materials, including a stack of sequentially applied sublayers (e.g., Ti, Cu and Ti) and can be deposited using a variety of processes (e.g., by sputtering a thin metal layer on the exposed surfaces.) A feature of the described approach is that the sputtered seed layer 1316 tends to coat all exposed surfaces including the sidewalls and bottoms of the via openings 1314. The deposition of the seed layer 1316 can also be limited to just a portion of the exposed surfaces.

Figure 13H:
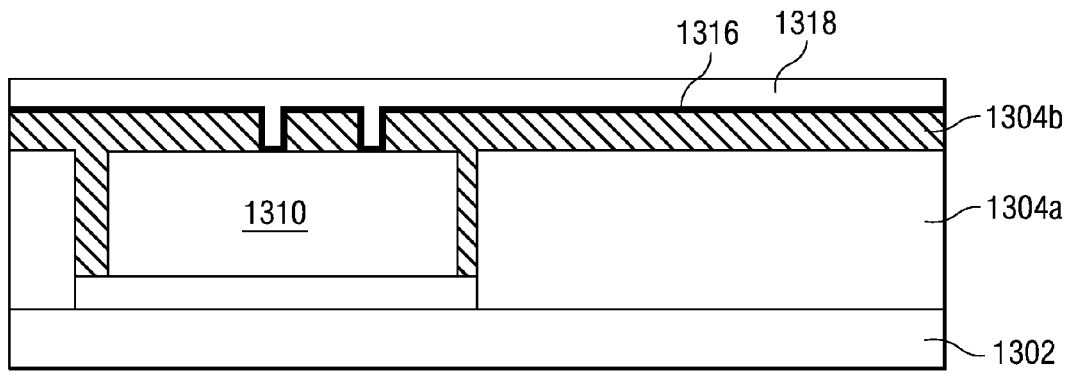
Figure 13I:
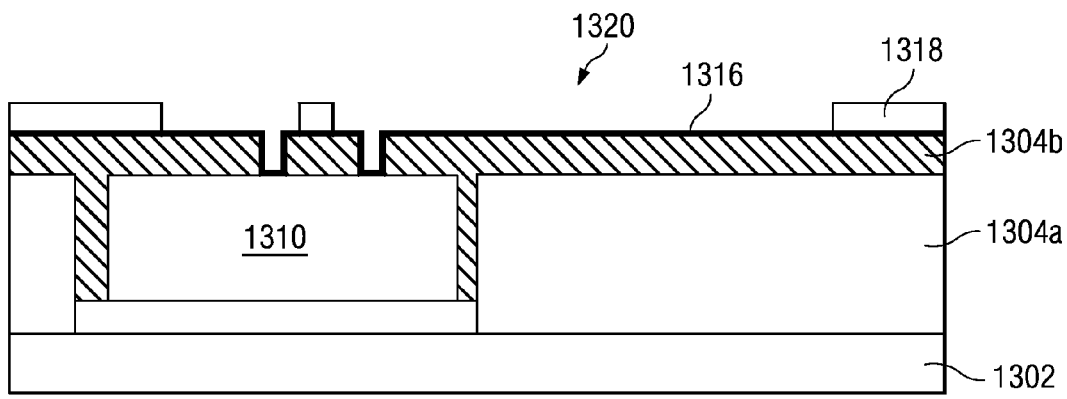

In FIG. 13H, a photoresist 1318 is applied over the seed layer. The photoresist 1318, which can be positive or negative, covers the seed layer and fills the opening. In FIG. 13I, the photoresist 1318 is patterned and developed to form open regions 1320 that expose the seed layer 1316. The open regions 1320 are patterned to reflect the desired layout of the antenna and the interconnect layer. This patterning process may also be used to form thermal pipes, conductive traces and vias as appropriate. After the desired open areas 1320 have been formed, the exposed portions of the seed layer are then electroplated to form the desired interconnect layer structures. In some embodiments, a portion of the seed layer (e.g., Ti) is etched prior to electroplating. During electroplating, a voltage is applied to the seed layer 1316 to facilitate the electroplating of a conductive material, such as copper, into the open regions. After the interconnect layer has been formed, the photoresist and the seed layer in the field is then stripped.

Figure 13J:
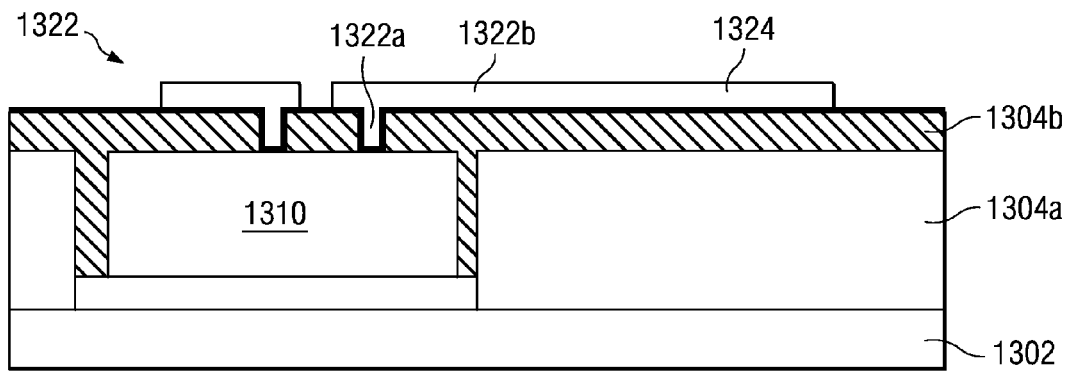

As a result, the antenna 1324 and the interconnect layer 1322 are formed over the epoxy layer, as illustrated in FIG. 13J (step 1210 and 1212). More specifically, the metal via 1322a, the trace 1322b and the antenna 1324 are formed substantially concurrently using the same electroplating step. The via 1322a connects to the trace 1322b, which in turn connects to the antenna 1324, thereby electrically connecting the antenna 1324 to the active face of the integrated circuit 1310.

FIG. 13J illustrates an example of how epoxy layers may be sequentially deposited to form a buffer of an appropriate size between the antenna 1324 and the substrate 1302 to improve the radiation efficiency of the antenna 1324. In the illustrated embodiment, for example, the integrated circuit package 1350 has been formed such that approximately 145 microns of SU-8 are interposed between the substrate 1302 and the antenna 1324. More specifically, the thickness T1 of the first epoxy layer 1304a is approximately 130 microns and the thickness T2 of the second epoxy layer 1304b is approximately 15 microns and the antenna 1324, the first and second epoxy layers 1304a/1304b are deposited immediately adjacent to one another. Thus, there is a distance between the antenna 1324 and the substrate 1302 that is entirely and solidly filled with multiple layers of epoxy whose collective thickness exceeds 130 microns. (Any intervening interconnect layers, conductive traces and vias, while are also electrically conductive, are generally much thinner and smaller than the substrate and do not appear to substantially reduce the radiation efficiency of the antenna.) Of course, the present invention contemplates a wide variety of embodiments where the number of layers, the dimensions of the layers and the layout of the integrated circuit package 1350 can depart substantially from what is shown in FIG. 13J.

Various additional operations may be performed over the top interconnect layer 1322 illustrated in FIG. 13J. By way of example, portions of the top interconnect layer 1322 may be shaped to form external I/O pads. The I/O pads may be covered with a suitable adhesion layer to facilitate wirebonding. In another embodiment, solder balls are applied to the I/O pads to connect the integrated circuit package to an external electrical device, such as a printed circuit board. In still another embodiment, additional epoxy layers are deposited over the interconnect layer 1322. Additional devices and interconnect structures (e.g., integrated circuits, passive devices, interconnect layers, antennae, external I/O pads, etc.) may be positioned between or on these epoxy layers. In some embodiments, the epoxy layers are later encapsulated in a molding material.

Afterward, portions of the substrate 1302 may be removed to make the substrate 1302 thinner. The desired degree of thinness typically depends on the type of package that is desired. For example, in a particular implementation a silicon handle wafer used as a substrate may originally have a thickness of 1 mm, and then be ground down to a thickness of approximately 300 microns, although other types of packages may involve different dimensions.

Figure 14A:
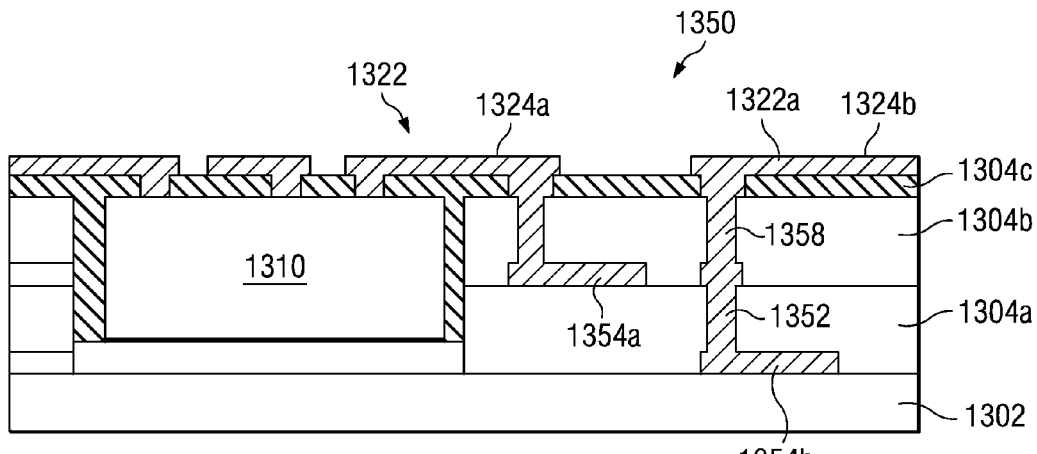
FIGS. 14A-14B and 15 are diagrammatic side and top views of an integrated circuit package with multiple antennae and grounding planes according to another embodiment of the present invention.
Figure 14B:
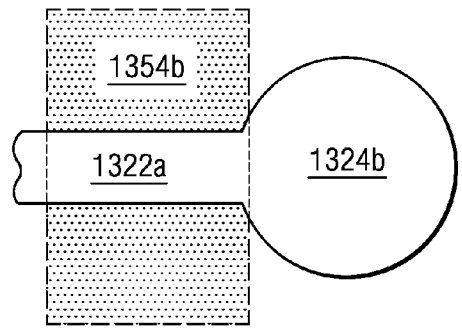

Referring next to FIG. 14A, a modified version of the integrated circuit package 1350 of FIG. 13J according to another embodiment of the present invention will be described. More specifically, the integrated circuit package 1350 includes first, second and third epoxy layers 1304a-1304c, first and second antennae 1324a/1324b and first and second grounding planes 1354a/1354b. The ground planes are electrically grounded and are sandwiched between layers of epoxy.

In some embodiments, the grounding plane helps to improve the signal integrity of signals that are sent from an integrated circuit to the antenna. An example of such a grounding plane is the second ground plane 1354b, a diagrammatic top view of which is illustrated in FIG. 14A. The second grounding plane 1354b is electrically coupled to the second antenna 1324b through a via 1358 that penetrates entirely through the first and second epoxy layers 1304a/1304b. In the illustrated embodiment, the second grounding plane 1354b forms a planar sheet that underlies a conductive trace 1322a that is coplanar with and extends out of the disc-shaped second antenna 1324b. The conductive trace 1322a connects the second antenna 1324b to the via 1358. The second grounding plane 1354b helps prevent other conductive structures within the integrated circuit package 1350 from interfering with the signals passing through the trace 1322*a*.

In still other embodiments, the grounding plane is arranged to serve as a reflector. For example, the grounding plane may be arranged to help reflect radiation from the antenna and direct it towards the exterior of the package and into the atmosphere. In this manner, the signals that are emitted from the antenna can be strengthened. In various embodiments, a reflective grounding plane is formed between portions of epoxy layers that are positioned below and/or directly underlie the antenna.

The grounding planes may be formed using the same techniques that are used to form the antenna and the interconnect layers of the integrated circuit package. To use one example, an exemplary method for an integrated circuit package with the first and second grounding planes 1354*a*/1354*b* may be described as follows: initially, the substrate 1302 is covered with a seed layer. A photoresist layer is deposited evenly over the seed layer. The photoresist is selectively exposed and developed to form open regions in the photoresist that approximate the shape of the second grounding plane 1354*b*.

Next, a metal is electroplated to form the second grounding plane 1354*b*. The photoresist and seed layer are removed. Then, the first epoxy layer 1304*a* is deposited. The first epoxy layer 1304*a* is exposed and developed to form open regions suitable for forming a via 1352. A seed layer is deposited over the open regions and the field of the first epoxy layer 1304*a*. A photoresist is again deposited and developed. Open regions are formed in the photoresist such that portions of the seed layer are exposed. Metal is electroplated into the open regions to form the first grounding plane 1354*a* and the via 1352. The above steps can be repeated to form some of the other vias and interconnect structures illustrated in FIG. 14A. After the first and second epoxy layers 1304*a*/1304*b* are deposited, a cavity may be formed for the integrated circuit 1310. At that point, the relevant steps from FIG. 12 may be performed to form additional interconnects and the first and second antennae 1324*a*/1324*b*. It should be appreciated that some of the aforementioned steps may be reordered, modified and/or eliminated to suit the needs of different applications.

Figure 15:
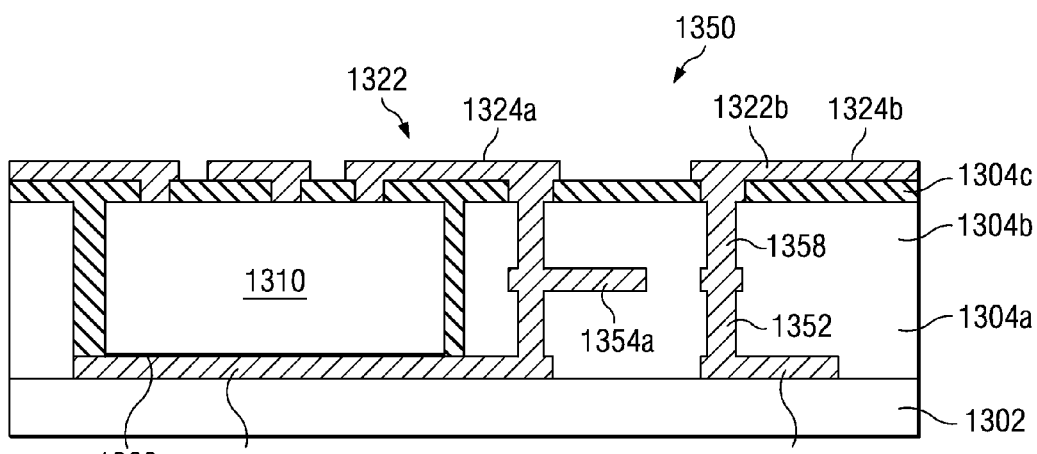

Referring next to FIG. 15, the integrated circuit package 1350 illustrated in FIG. 14A with a modified interconnect structure according to another embodiment of the present invention will be described. In the illustrated embodiment, the back surface of the integrated circuit 1310 includes a ground contact 1360. This electrically grounded contact may take any suitable form, including a metal layer that covers substantially the entire back surface of the integrated circuit 1310. The ground contact 1360 on the back surface of the integrated circuit 1310 is coupled to an underlying conductive trace 1362 with an electrically conductive die attach. The conductive trace 1362 is electrically coupled to the first grounding plane 1354*a*. Thus, the ground contact 1360 of the integrated circuit 1310 provides a common ground reference potential for one or more other electrical components in the integrated package, including the first ground plane 1354*a*.

Figure 16:
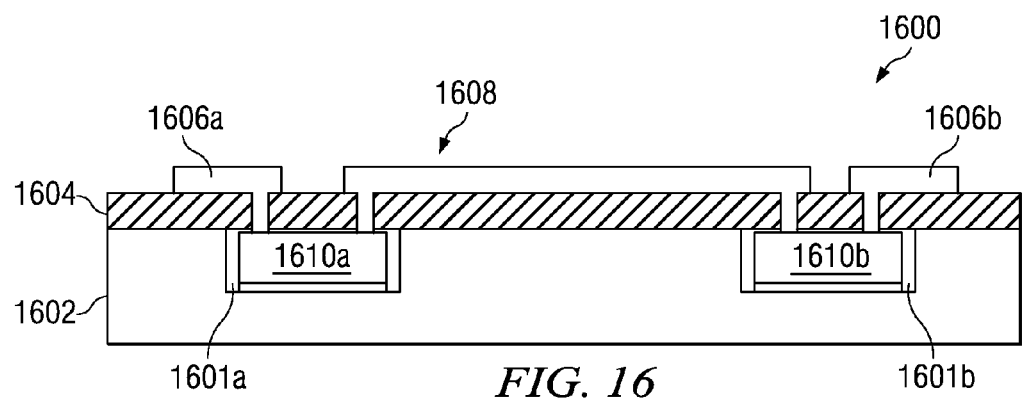
FIGS. 16-18 are diagrammatic side views of packages with multiple integrated antennae and dice according to various embodiments of the present invention.

Referring now to FIG. 16, an integrated circuit package 1600 having a substrate 1602 with embedded dice according to a particular embodiment of the present invention will be described. The integrated circuit package 1600 includes a substrate 1602 with two cavities 1601*a*/1601*b*. Two integrated circuits 1610*a*/1610*b* are positioned within the two cavities 1601*a*/1601*b*. The active faces of the integrated circuits 1610*a*/1610*b* are covered with a self-planarizing, photo-imageable epoxy layer 1604. An interconnect layer 1608 is formed over the epoxy layer 1604 and includes vias that connect to I/O pads on the integrated circuits. The antennae 1606*a*/1606*b*, which are also formed over the epoxy layer 1604, are electrically coupled with the active faces of the integrated circuits 1610*a*/1610*b* through the interconnect layer 1608.

The integrated circuit package 1600 may also include additional epoxy layers, fewer or more integrated circuits and antennae that are positioned in different locations in the package. In a particular embodiment, the epoxy layer 1604 is relatively thin (e.g., less than 20 microns), and thus the distance between the antenna 1606*a* and the substrate 1602 is small. In this implementation, the substrate 1602 is preferably formed from high-resistivity silicon or an electrically non-conductive material, such as quartz, to help prevent a reduction in the radiation efficiency of the antennae 1606*a*. In another embodiment, the epoxy layer 1604 has a far greater thickness (e.g., between 100 and 150 microns or more) and the substrate 1602 is formed from a conventional semiconductor material.

Figure 17:
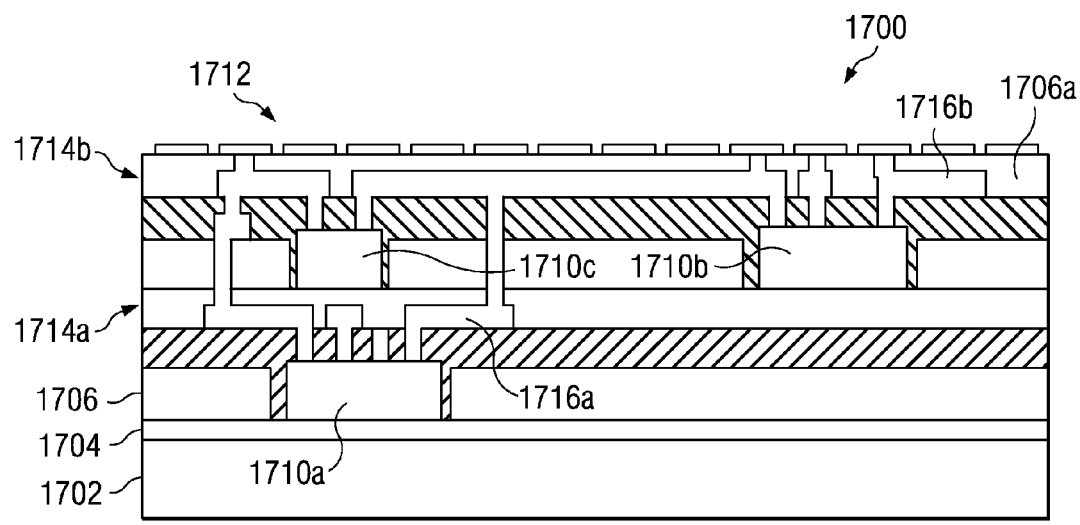

Referring next to FIG. 17, a package with multiple integrated circuits, interconnect layers and antennae according to a particular embodiment of the present invention will be described. The integrated circuit package 1700 includes multiple epoxy layers 1706, first, second and third integrated circuits 1710*a*-1710*c*, first and second interconnect layers 1714*a*/1714*b*, and first and second antennae 1716*a*/1716*b*. The first and second antennae 1716*a*/1716*b* are coupled respectively with the active faces of the first and second integrated circuits 1710*a*/1710*b* through the first and second interconnect layers 1714*a*/1714*b*. A topmost epoxy layer 1706*a* covers the integrated circuits and the interconnect layers. I/O pads 1712 are formed on the topmost epoxy layer 1706*a* and are electrically connected to the integrated circuits through various vias and the interconnect layers. The back surface of the first integrated circuit 1710*a* is thermally and physically attached with a heat sink 1704, which is positioned between the stacked epoxy layers and the substrate 1702.

Antennae can be embedded in multiple epoxy layers and/or sandwiched between adjacent epoxy layers. One antenna may be positioned higher in the package than another, as is the case with the first and second antennae. In some embodiments, the antennae are arranged to communicate wirelessly with one another, in addition to or instead of communicating with a device external to the package. The integrated circuits may be stacked over one another (e.g., the first and third integrated circuits 1710*a*/1710*c*), embedded in the same epoxy layer (e.g., the second and third integrated circuits 1710*b*/1710*c*) and/or positioned between different epoxy layers (e.g., the first and second integrated circuits 1710*a*/1710*b*.)

Figure 18:
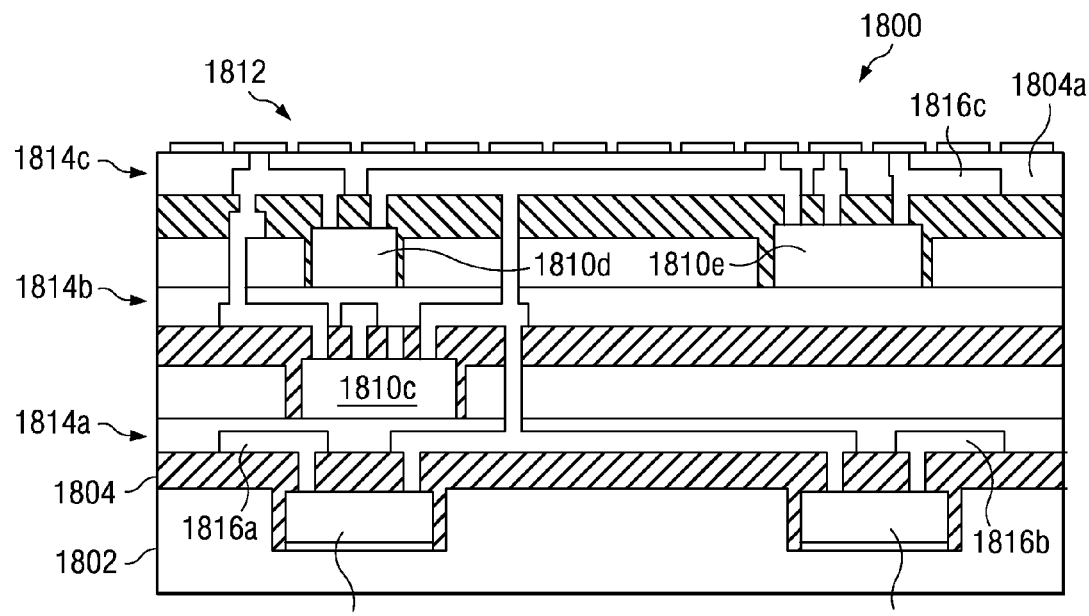

Referring next to FIG. 18, an integrated circuit package 1800 that combines some of the aforementioned features according to another embodiment of the present invention will be described. The integrated circuit package 1800 includes first, second, third, fourth and fifth integrated circuits 1810*a*-1810*e*, first, second and third interconnect layers 1814*a*-1814*c* and external I/O pads 1812. The first and second integrated circuits 1810*a*/1810*b* are embedded in a substrate 1802 and are electrically coupled to each other and to the first and second antennae 1816*a*/1816*b* respectively through the first interconnect layer 1814*a*. The first, third and fourth integrated circuits 1814*a*/1814*c*/1814*d* are stacked over one another and are electrically coupled with one another through the first, second and third interconnect layers 1814*a*-1814*c*. The fourth and fifth integrated circuits 1814*c*/1814*d* are positioned between the same epoxy layers and are coupled to one another through the third interconnect layer

1814c. The fifth integrated circuit is electrically coupled to a third antenna 1816c. The third antenna 1816c and the third interconnect layer 1814c are covered with a topmost epoxy layer 1804a, upon which multiple external I/O pads 1812 are formed. The I/O pads 1812 are arranged to couple the integrated circuits within the package with an external electrical device through the first, second and third interconnect layers 1814a-1814c. The packages illustrated in FIGS. 17 and 18 may be formed using the operations described in connection with FIGS. 2, 3A-3K, 12 and 13A-13J.

Although only a few embodiments of the invention have been described in detail, it should be appreciated that the invention may be implemented in many other forms without departing from the spirit or scope of the invention. For example, the various embodiments described herein are sometimes illustrated with distinctive and different features. The present invention, however, contemplates a wide variety of integrated circuit packages that can each contain almost any combination of the features described herein and be formed using almost any combination of the processes described herein. By way of example, FIGS. 7A-7C illustrate an embodiment in which multiple microsystems made from layers of epoxy are formed over a single substrate made from a semiconductor material. Each illustrated microsystem 704 can be replaced with a microsystem with the features and components of the package designs (minus the substrate) illustrated in FIGS. 11A-11B, 14A-14B and 15-18. Each microsystem can then be formed concurrently using the steps described in FIG. 12. The single common substrate mechanically supports the microsystems during their formation. After the formation of the microsystems is completed, they are covered with molding material, which covers and fills spaces between the microsystems. The molding material holds the microsystems together and helps eliminate the need for the substrate. Afterward, the substrate may be entirely ground away or otherwise removed. The encapsulated structure may then be singulated to form multiple integrated circuit packages.

Additionally, it should be noted that references to a single epoxy layer (e.g, "the first epoxy layer") do not necessarily mean that the epoxy layer in question was formed in a single operation. More specifically, the layer may be formed using operations such as spin- and spray-coating or sheet lamination. Each layer may be made of one layer of epoxy applied in only one such operation, or may be made of multiple sublayers that are applied in multiple such operations. In the description, there are also occasional references to relative spatial terms, such as "higher," "above" and "below" (e.g., "the integrated circuit die may be below the antenna," etc.) In various embodiments, these terms can be understood based on the direction in which the epoxy layers of the package are deposited. That is, the package can be formed using the sequential deposition of epoxy layers. The substrate forms the bottom of the future package, and thus can be considered "below" or "lower" than any epoxy layer that is deposited on the top surface of the substrate. Each epoxy layer has a bottom surface and opposing top surface that is substantially parallel to the top surface of the substrate. Layers of epoxy are sequentially applied over one another along a direction (i.e., a vertical dimension) that is perpendicular to the top surface of the substrate. If a structure A is described as "higher" or "above" a structure B, it may mean that structure A is on or embedded in an epoxy layer that was deposited later than the epoxy layer that structure B is deposited or embedded in. Moreover, the term "thickness" may refer to a dimension as measured along the vertical dimension. This understanding of "higher," "lower," "above," "below" and "thickness" need not apply to every use of the term, but only to particular embodiments. Therefore, the present embodiments should be considered as illustrative and not restrictive and the invention is not limited to the details given herein, but may be modified within the scope and equivalents of the appended claims.

What is claimed is:

1. An integrated circuit package comprising:
   a substrate;
   a plurality of immediately adjacent stacked layers of cured, planarizing, photo-imageable epoxy formed over the substrate, wherein the epoxy layers include at least one patterned epoxy layer;
   a first integrated circuit having an active surface that is embedded in one of the epoxy layers;
   at least one interconnect layer that includes at least one conductive via, the at least one interconnect layer being embedded in one of the epoxy layers; and
   a first antenna that is formed from a conductive material and is electrically coupled with the active face of the first integrated circuit through at least one of the interconnect layers, the first antenna being formed over one of the epoxy layers, wherein at least one of the epoxy layers is positioned between first antenna and the substrate; wherein
   the plurality of stacked epoxy layers includes at least one epoxy layer that covers the first antenna such that the first antenna is not exposed;
   the first integrated circuit is positioned in a first layer of the plurality of the epoxy layers;
   the integrated circuit package further comprises a second integrated circuit that is positioned in a second layer of the plurality of epoxy layers; and
   the first antenna is positioned between the first and second epoxy layers.

2. An integrated circuit package as recited in claim 1, wherein the substrate is formed from a semiconductor material and at least some of the epoxy layers are positioned between the substrate and the first antenna such that the distance between the substrate and the first antenna is at least approximately 100 microns, thereby helping to improve the radiation efficiency of the first antenna.

3. An integrated circuit package as recited in claim 2, wherein the distance between the substrate and the first antenna is at least approximately 140 microns.

4. An integrated circuit package as recited in claim 2, wherein there is no structure in the integrated circuit package that has a thickness of greater than 200 microns and that is made of one selected from a group consisting of a semiconductor material and an electrically conductive material and that is within 100 microns of the first antenna.

5. An integrated circuit package as recited in claim 1, wherein the substrate is formed from one selected from a group consisting of G10-FR4, quartz and silicon and the epoxy layers are made from SU-8.

6. An integrated circuit package as recited in claim 1, further comprising a ground plane that is sandwiched between two of the epoxy layers, wherein the ground plane is made of a conductive material and is electrically grounded.

7. An integrated circuit package as recited in claim 6, wherein:
   the first integrated circuit includes a ground contact; and
   the ground plane is electrically coupled with the ground contact on the first integrated circuit.

8. An integrated circuit as recited in claim 7, wherein:
   the at least one interconnect layer includes a first interconnect layer having at least a first portion and a second portion;

the ground contact of the first integrated circuit is on the back surface of the first integrated circuit;

the back surface of the first integrated circuit is electrically coupled to a first portion of the first interconnect layer using an electrically conductive die attach; and the ground plane is electrically coupled to a second portion of the first interconnect layer and is thereby electrically coupled to the ground contact of the first integrated circuit.

9. An integrated circuit package as recited in claim 6, wherein the ground plane is arranged under the first antenna to reflect radiation from the first antenna away from and out of the integrated circuit package.

10. An integrated circuit package as recited in claim 1, further comprising:

a second integrated circuit that is positioned in a cavity in the substrate, wherein the substrate is made of high-resistivity silicon.

11. An integrated circuit as recited in claim 1, further comprising:

a second integrated circuit; and a second antenna that is electrically coupled with the second integrated circuit.

12. An integrated circuit package comprising:

a substrate formed from a semiconductor material;

a plurality of immediately adjacent layers of cured, planarizing, photo-imageable epoxy that are stacked over the substrate;

a first integrated circuit positioned within one of the epoxy layers and having an active surface, wherein at least one of the epoxy layers extends over the active surface of the first integrated circuit;

at least one interconnect layer, wherein each interconnect layer is embedded in an associated patterned epoxy layer and includes at least one trace and at least one via, the interconnect layer being sandwiched between layers of epoxy; and a first antenna that is arranged to emit electromagnetic radiation to transmit signals from the first integrated circuit, the first antenna being electrically coupled to the first integrated circuit through the at least one interconnect layer, wherein:

at least some of the epoxy layers are stacked between the first antenna and the substrate; and neither the substrate nor any other large conductive structure is within 100 microns of the first antenna, a large conductive structure being defined as a structure that is made of one selected from a group consisting of a semiconductor material and an electrically conductive material and that has a thickness that is greater than 300 microns; wherein the first integrated circuit is positioned in a first layer of the plurality of the epoxy layers;

the integrated circuit package further comprises a second integrated circuit that is positioned in a second layer of the plurality of epoxy layers; and the first antenna is positioned between the first and second epoxy layers.

13. An integrated circuit package comprising:

a substrate;

a plurality of immediately adjacent stacked layers of cured, planarizing, photo-imageable epoxy formed over the substrate, wherein the epoxy layers include at least one patterned epoxy layer;

a first integrated circuit having an active surface that is embedded in one of the epoxy layers;

at least one interconnect layer that includes at least one conductive via, the at least one interconnect layer being embedded in one of the epoxy layers;

a first antenna that is formed from a conductive material and is electrically coupled with the active face of the first integrated circuit through at least one of the interconnect layers, the first antenna being formed over one of the epoxy layers, wherein at least one of the epoxy layers is positioned between first antenna and the substrate; and a ground plane that is sandwiched between two of the epoxy layers, wherein the ground plane is made of a conductive material and is electrically grounded;

the first integrated circuit includes a ground contact;

the ground plane is electrically coupled with the ground contact on the first integrated circuit;

the at least one interconnect layer includes a first interconnect layer having at least a first portion and a second portion;

the ground contact of the first integrated circuit is on the back surface of the first integrated circuit;

the back surface of the first integrated circuit is electrically coupled to a first portion of the first interconnect layer using an electrically conductive die attach; and the ground plane is electrically coupled to a second portion of the first interconnect layer and is thereby electrically coupled to the ground contact of the first integrated circuit.

* * * * *